United States Patent
Mundhada et al.

(10) Patent No.: US 11,791,818 B2
(45) Date of Patent: Oct. 17, 2023

(54) JOSEPHSON NONLINEAR CIRCUIT

(71) Applicant: Yale University, New Haven, CT (US)

(72) Inventors: Shantanu Mundhada, New Haven, CT (US); Nicholas Frattini, New Haven, CT (US); Shruti Puri, New Haven, CT (US); Shyam Shankar, New Haven, CT (US); Steven M. Girvin, Hamden, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 167 days.

(21) Appl. No.: 17/423,631

(22) PCT Filed: Jan. 15, 2020

(86) PCT No.: PCT/US2020/013675
§ 371 (c)(1),
(2) Date: Jul. 16, 2021

(87) PCT Pub. No.: WO2020/150348
PCT Pub. Date: Jul. 23, 2020

(65) Prior Publication Data
US 2022/0103172 A1 Mar. 31, 2022

Related U.S. Application Data

(60) Provisional application No. 62/812,714, filed on Mar. 1, 2019, provisional application No. 62/793,850, filed on Jan. 17, 2019.

(51) Int. Cl.
H03K 17/92 (2006.01)
H10N 69/00 (2023.01)
(Continued)

(52) U.S. Cl.
CPC .............. *H03K 17/92* (2013.01); *H10N 69/00* (2023.02); *G06N 10/00* (2019.01); *H10N 60/805* (2023.02)

(58) Field of Classification Search
CPC ...................................................... H03K 17/92
(Continued)

(56) References Cited

U.S. PATENT DOCUMENTS 3,275,943 A 9/1966 Robert
3,663,886 A 5/1972 Blume
(Continued)

FOREIGN PATENT DOCUMENTS

CA 2 470 845 A1 6/2003
CN 1270674 A 10/2000
(Continued)

OTHER PUBLICATIONS

Frattini et al., Superconducting nonlinear asymmetric inductive element and related systems and methods. Co-pending U.S. Appl. No. 16/770,942, filed Jun. 8, 2020.
(Continued)

*Primary Examiner* — Tomi Skibinski
(74) *Attorney, Agent, or Firm* — Wolf, Greenfield & Sacks, P.C.

(57) ABSTRACT

Parametrically pumped four-wave mixing is a key building block for many developments in the field of superconducting quantum information processing. However, undesired frequency shifts such as Kerr, cross-Ken and Stark shifts inherent with four-wave mixing, lead to difficulties in tuning up the desired parametric processes and, for certain applications, severely limit the fidelities of the resulting operations. Some embodiments include a Josephson four-wave mixing device consisting of a SQUID transmon coupled to a half-flux biased SNAIL transmon, a.k.a. capacitively
(Continued)

shunted flux qubit. When the two transmon have matching frequencies, an interference effect cancels the negative Kerr of the SQUID transmon with the positive Kerr of the SNAIL transmon while preserving parametric four-wave mixing capabilities.

23 Claims, 10 Drawing Sheets

(51) Int. Cl.
  *G06N 10/00* (2022.01)
  *H10N 60/80* (2023.01)
(58) Field of Classification Search
  USPC .......................................................... 327/528
  See application file for complete search history.

(56) References Cited

U.S. PATENT DOCUMENTS

| | | |
|---|---|---|
| 4,344,052 A | 8/1982 | Davidson |
| 4,403,189 A | 9/1983 | Simmonds |
| 4,585,999 A | 4/1986 | Hilbert et al. |
| 4,956,312 A | 9/1990 | Van Laarhoven |
| 5,105,166 A | 4/1992 | Tsukii et al. |
| 5,254,950 A | 10/1993 | Fan et al. |
| 5,326,986 A | 7/1994 | Miller, Jr. et al. |
| 5,420,100 A | 5/1995 | Vittoria et al. |
| 5,493,719 A | 2/1996 | Smith et al. |
| 5,582,877 A | 12/1996 | Nagamachi et al. |
| 5,635,834 A | 6/1997 | Sloggett et al. |
| 5,661,494 A | 8/1997 | Bondyopadhyay |
| 5,920,811 A | 7/1999 | Suzuki et al. |
| 6,549,059 B1 | 4/2003 | Johnson |
| 6,578,018 B1 | 6/2003 | Ulyanov |
| 6,621,374 B2 | 9/2003 | Higgins et al. |
| 6,627,915 B1 | 9/2003 | Ustinov et al. |
| 6,635,898 B2 | 10/2003 | Williams et al. |
| 6,822,255 B2 | 11/2004 | Tzalenchuk et al. |
| 6,838,694 B2 | 1/2005 | Esteve et al. |
| 6,900,454 B2 | 5/2005 | Blais et al. |
| 6,911,664 B2 | 6/2005 | Il'ichev et al. |
| 6,943,368 B2 | 9/2005 | Amin et al. |
| 7,042,005 B2 | 5/2006 | Il'ichev et al. |
| 7,129,869 B2 | 10/2006 | Furuta et al. |
| 7,253,654 B2 | 8/2007 | Amin |
| 7,307,275 B2 | 12/2007 | Lidar et al. |
| 7,364,923 B2 | 4/2008 | Lidar et al. |
| 7,369,093 B2 | 5/2008 | Oppenländer et al. |
| 7,443,720 B2 | 10/2008 | Astafiev et al. |
| 7,498,832 B2 | 3/2009 | Baumgardner et al. |
| 7,533,068 B2 | 5/2009 | Maassen van den Brink et al. |
| 7,724,083 B2 | 5/2010 | Herring et al. |
| 7,800,395 B2 | 9/2010 | Johnson et al. |
| 7,876,248 B2 | 1/2011 | Berkley et al. |
| 7,899,092 B2 | 3/2011 | Malinovsky |
| 7,932,515 B2 | 4/2011 | Bunyk et al. |
| 8,032,474 B2 | 10/2011 | Macready et al. |
| 8,106,717 B2 | 1/2012 | Ichimura et al. |
| 8,111,083 B1 | 2/2012 | Pesetski et al. |
| 8,138,784 B2 | 3/2012 | Przybysz et al. |
| 8,179,133 B1 | 5/2012 | Kornev et al. |
| 8,234,103 B2 | 7/2012 | Biamonte et al. |
| 8,416,109 B2 | 4/2013 | Kirichenko |
| 8,508,280 B2 | 8/2013 | Naaman et al. |
| 8,514,478 B1 | 8/2013 | Spence |
| 8,922,239 B2 | 12/2014 | Pesetski et al. |
| 9,467,126 B1 | 10/2016 | Naaman et al. |
| 9,892,365 B2 | 2/2018 | Rigetti et al. |
| 9,948,254 B2 | 4/2018 | Narla et al. |
| 10,305,015 B1 | 5/2019 | Brink et al. |
| 10,404,214 B2 | 9/2019 | Szöcs et al. |
| 10,461,385 B2 | 10/2019 | Sliwa et al. |
| 10,541,659 B2 | 1/2020 | Abdo et al. |
| 10,693,566 B2 | 6/2020 | Sliwa et al. |
| 11,184,006 B2 | 11/2021 | Wang et al. |
| 11,271,533 B2 | 3/2022 | Narla et al. |
| 2001/0025012 A1 | 9/2001 | Tarutani et al. |
| 2002/0188578 A1 | 12/2002 | Amin et al. |
| 2003/0136973 A1 | 7/2003 | Ogawa et al. |
| 2003/0193097 A1 | 10/2003 | Il'ichev et al. |
| 2004/0059760 A1 | 3/2004 | Ageishi et al. |
| 2004/0077503 A1 | 4/2004 | Blais et al. |
| 2004/0128081 A1 | 7/2004 | Rabitz et al. |
| 2004/0140537 A1 | 7/2004 | Il'ichev et al. |
| 2005/0001209 A1 | 1/2005 | Hilton et al. |
| 2005/0117836 A1 | 6/2005 | Franson et al. |
| 2005/0134377 A1 | 6/2005 | Dent |
| 2005/0224784 A1 | 10/2005 | Amin et al. |
| 2006/0097747 A1 | 5/2006 | Amin |
| 2006/0179029 A1 | 8/2006 | Vala et al. |
| 2007/0174227 A1 | 7/2007 | Johnson et al. |
| 2007/0215862 A1 | 9/2007 | Beausoleil et al. |
| 2007/0296953 A1 | 12/2007 | Allen et al. |
| 2008/0100175 A1 | 5/2008 | Clark |
| 2008/0274898 A1 | 11/2008 | Johnson et al. |
| 2008/0297230 A1 | 12/2008 | Dzurak et al. |
| 2009/0028340 A1 | 1/2009 | Trifonov |
| 2009/0033369 A1 | 2/2009 | Baumgardner et al. |
| 2009/0074355 A1 | 3/2009 | Beausoleil et al. |
| 2009/0153180 A1 | 6/2009 | Herr et al. |
| 2009/0232191 A1 | 9/2009 | Gupta et al. |
| 2009/0258787 A1 | 10/2009 | Wilkie et al. |
| 2009/0289638 A1 | 11/2009 | Farinelli et al. |
| 2010/0241780 A1 | 9/2010 | Friesen |
| 2010/0246152 A1 | 9/2010 | Lin et al. |
| 2011/0060710 A1 | 3/2011 | Amin |
| 2011/0079889 A1 | 4/2011 | Baillin |
| 2012/0074509 A1 | 3/2012 | Berg et al. |
| 2012/0319085 A1 | 12/2012 | Gambetta et al. |
| 2012/0319684 A1 | 12/2012 | Gambetta et al. |
| 2012/0326130 A1 | 12/2012 | Maekawa et al. |
| 2012/0326720 A1 | 12/2012 | Gambetta et al. |
| 2013/0029848 A1 | 1/2013 | Gonzalez et al. |
| 2013/0043945 A1 | 2/2013 | McDermott et al. |
| 2013/0107352 A1 | 5/2013 | Santori et al. |
| 2013/0196855 A1 | 8/2013 | Poletto et al. |
| 2013/0271265 A1 | 10/2013 | Finn |
| 2014/0167836 A1 | 6/2014 | Gambetta et al. |
| 2014/0176203 A1 | 6/2014 | Matheny et al. |
| 2014/0314419 A1 | 10/2014 | Paik |
| 2015/0028970 A1 | 1/2015 | Chow et al. |
| 2015/0241481 A1 | 8/2015 | Narla et al. |
| 2016/0308502 A1 | 10/2016 | Abdo et al. |
| 2017/0039481 A1 | 2/2017 | Abdo |
| 2017/0193388 A1 | 7/2017 | Filipp et al. |
| 2018/0040935 A1 | 2/2018 | Sliwa et al. |
| 2018/0054165 A1 | 2/2018 | Szöcs et al. |
| 2018/0138987 A1 | 5/2018 | Sliwa et al. |
| 2018/0198427 A1 | 7/2018 | Narla et al. |
| 2018/0232652 A1 | 8/2018 | Curtis et al. |
| 2018/0240035 A1 | 8/2018 | Scheer et al. |
| 2018/0247217 A1 | 8/2018 | Heeres et al. |
| 2018/0247974 A1 | 8/2018 | Oliver et al. |
| 2018/0341874 A1* | 11/2018 | Puri ..................... H03F 19/00 |
| 2019/0020346 A1 | 1/2019 | Wang et al. |
| 2019/0190474 A1 | 6/2019 | Abdo et al. |
| 2020/0258003 A1 | 8/2020 | Rigetti et al. |
| 2020/0287540 A1 | 9/2020 | Smith et al. |
| 2020/0334104 A1 | 10/2020 | Rosenblum et al. |
| 2021/0021245 A1 | 1/2021 | Frattini et al. |
| 2021/0234084 A1 | 7/2021 | Abdo |
| 2021/0265964 A1 | 8/2021 | Miano et al. |
| 2022/0020912 A1 | 1/2022 | Abdo |

FOREIGN PATENT DOCUMENTS

| | | |
|---|---|---|
| CN | 101548512 A | 9/2009 |
| CN | 102037475 A | 4/2011 |
| CN | 103778593 A | 5/2014 |
| EP | 0 513 856 A2 | 11/1992 |
| EP | 2 249 173 A1 | 11/2010 |
| EP | 2 264 799 A1 | 12/2010 |

(56) References Cited

FOREIGN PATENT DOCUMENTS

| | | |
|---|---|---|
| GB | 1 370 647 A | 10/1974 |
| JP | S61-067304 A | 4/1986 |
| JP | S62-172769 A | 7/1987 |
| JP | S62-172770 A | 7/1987 |
| JP | H06-265612 A | 9/1994 |
| JP | 2-924421 B2 | 7/1999 |
| JP | H11-266153 A | 9/1999 |
| JP | 2001-345488 A | 12/2001 |
| JP | 2004-080129 A | 3/2004 |
| JP | 2006-344761 A | 12/2006 |
| JP | 2012-109652 A | 6/2012 |
| JP | 2013-004717 A | 1/2013 |
| JP | 2014-503890 A | 2/2014 |
| JP | 2016-541146 A | 12/2016 |
| RU | 2 106 717 C1 | 3/1998 |
| RU | 2 212 671 C1 | 9/2003 |
| RU | 2010 124 198 A | 12/2011 |
| WO | WO 2015/102694 A2 | 7/2015 |
| WO | WO 2017/065658 A1 | 4/2017 |
| WO | WO 2018/182571 A1 | 10/2018 |

OTHER PUBLICATIONS

Partial Supplementary European Search Report for Application No. EP 14854592.4 dated Mar. 29, 2017.
Extended European Search Report for European Application No. EP 14854592.4 dated Aug. 10, 2017.
International Search Report and Written Opinion for International Application No. PCT/US2014/060694 dated Apr. 2, 2015.
International Preliminary Report on Patentability for International Application No. PCT/US2014/060694 dated Apr. 28, 2016.
Extended European Search Report for European Application No. EP 16756465.7 dated Sep. 28, 2018.
International Search Report and Written Opinion for International Application No. PCT/US2016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/US2016/019819 dated May 3, 2016.
International Preliminary Report on Patentability for International Application No. PCT/US2016/019819 dated Sep. 8, 2017.
Extended European Search Report for European Application No. 16780864.1, dated Mar. 5, 2019.
Invitation to Pay Additional Fees for International Application No. PCT/US2016/027817 dated Jun. 3, 2016.
International Search Report and Written Opinion for International Application No. PCT/US2016/027817 dated Aug. 22, 2016.
International Preliminary Report on Patentability for International Application No. PCT/US2016/027817 dated Oct. 26, 2017.
Extended European Search Report for European Application No. 17739044.0, dated Jul. 19, 2019.
International Search Report and Written Opinion for International Application No. PCT/US2017/013426 dated Apr. 5, 2017.
International Preliminary Report on Patentability for International Application No. PCT/US2017/013426 dated Jul. 26, 2018.
International Search Report and Written Opinion for International Application No. PCT/US2018/064922, dated Mar. 8, 2019.
International Preliminary Report on Patentability for International Application No. PCT/US2018/064922, dated Jun. 25, 2020.
International Search Report and Written Opinion for International Application No. PCT/US2020/013675, dated Mar. 31, 2020.
International Preliminary Report on Patentability for International Application No. PCT/US2020/013675, dated Jul. 29, 2021.
Extended European Search Report for European Application No. 20741852.6, dated Sep. 7, 2022.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson amplifier for qubit readout. Appl Phys Lett. 2011;99(16):162506. doi: 10.1063/1.3653473.
Abdo et al., Josephson directional amplifier for quantum measurement of superconducting circuits. Phys Rev Lett. Apr. 25, 2014;112:167701.1-5. doi: 10.1103/PhysRevLett.112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310.1523v2. 15 pages.
Araujo et al., A LEKID-based CMB instrument design for large-scale observations in Greenland. Proc of SPIE—The International Society for Optical Engineering. Aug. 4, 2014;9153:91530W. doi: 10.1117/12.2056828.
Barends et al., Minimizing quasiparticle generation from stray infrared light in superconducting quantum circuits, Appl Phys Lett. Sep. 13, 2011;99(11):113507.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature. May 2010;465(7294):64-8. arXiv:0912.3407v1. 20 pages.
Bergeal et al., Phase-preserving amplification near the quantum limit with a Josephson ring modulator. Nature. 2010;465:64-9.
Bianchetti et al., Dynamics of dispersive single qubit read-out in circuit quantum electrodynamics. Phys. Rev. A. Oct. 30, 2009;80:043840.
Bockstiegel et al., Development of broadband NbTiN traveling wave parametric amplifier for MKID readout. J Low Temp Phys. 2014; 176:476-82.
Burgarth et al., Non-Abelian phases from quantum Zeno dynamics. Phys Rev A. Oct. 9, 2013;88:042107.1-5. doi: 10.1103/PhysRevA.88.042107.
Campagne-Ibarcq et al., Observing quantum state diffusion by heterodyne detection of fluorescence. Phys Rev X. 2016;6:011002.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Castellanos-Beltran et al., Widely tunable parametric amplifier based on a superconducting quantum interference device array resonator. Applied Physics Letters. 2007;91(8). 4 pages.
Catelani et al., Relaxation and frequency shifts induced by quasiparticles in superconducting qubits, Phys Rev B. 2011;84(6) 064517.
Caves, Quantum limits on noise in linear amplifiers. Phys. Rev. D. 1982;26(8):1817-39.
Chaturvedi et al., Berry's phase for coherent states. J Phys A: Math Gen. 1987;20(16):L1071- 5.
Corcoles et al., Protecting superconducting qubits from radiation. App Phys Lett. 2011;99(18):181906.
Court et al., Quantitative study of quasiparticle traps using the single-Cooper-pair transistor. Phys Rev B. 2008;77(10):100501.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Lange et al., Reversing quantum trajectories with analog feedback. Phys Rev Lett. 2014;112:080501.
De Ponte et al., Relaxation- and decoherence-free subspaces in networks of weakly and strongly coupled resonators. Ann Phys. Mar. 12, 2007;322:2077-84.

(56) References Cited

OTHER PUBLICATIONS

Devoret et al., Superconducting Circuits for Quantum Information: An Outlook. Science. Mar. 8, 2013;339:1169-74. doi: 10.1126/science.1231930.

Didier, The Josephson effect in superconductors and quantum gases. Joseph Fourier University Thesis. Nov. 24, 2009:1-263.

Dolan, Offset masks for lift-off photoprocessing. App Phys Lett. 1977;31(5):337-9.

Duan et al., Preserving Coherence in Quantum Computation by Pairing Quantum Bits. Phys Rev Lett. Sep. 8, 1997;79(10-8):1953-6.

Eichler et al., Controlling the dynamic range of a Josephson parametric amplifier. EPJ Quantum Tech. Jan. 29, 2014;1(2). doi:10.1140/epjqt2. 19 pages.

Facchi et al., Quantum Zeno Subspaces. Phys Rev Lett. Aug. 19, 2002;89(8):080401.1-4.

Flurin et al., Superconducting quantum node for entanglement and storage of microwave radiation. Phys Rev Lett. Mar. 6, 2015;114(9):090503. Epub Mar. 4, 2015.

Flurin et al., Generating entangled microwave radiation over two transmission lines. Phys Rev Lett. Nov. 2, 2012;109(18):183901. Epub Oct. 31, 2012.

Frattini et al., 3-wave mixing Josephson dipole element. App Phys Lett. 2017;110:222603-4.

Friedrich et al., Experimental quasiparticle dynamics in a superconducting, imaging x-ray spectrometer, App Phys Lett. 1997;71(26):3901.

Gan et al., Research on the Measurement for Quantum State of Microwave Single Photon in Superconducted Josephson Junction. Journal of Lanzhou University of Arts and Science (Natural Science Edition). Jan. 10, 2015;29(1):22-4, 28.

Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.

Govenius et al., Parity of measurement of remote qubits using dispersive coupling and photodetection. Phys. Rev. A. Oct. 1, 2015;92(4):042305.

Gueron, Quasiparticles in a diffusive conductor: interaction and pairing, Universite Pierre et Marie Curie—Paris VI. 1997, 241 pages.

Hatridge et al., Dispersive magnetometry with a quantum limited SQUID parametric amplifier. Phys Rev B. Apr. 2011;83(13):134501-1-8.

Hatridge et al., Quantum back-action of an individual variable-strength measurement. Science. Jan. 11, 2013; 339(6116): 178-81. doi: 10.1126/science.1226897.

Heeres et al., Cavity State Manipulation Using Photon-Number Selective Phase Gates. Phys Rev Lett. Sep. 25, 2015;115:137002.1-5. doi: 10.1103/PhysRevLett.115.137002.

Ho Eom et al., A wideband, low-noise superconducting amplifier with high dynamic range. Nature Physics. 2012;8(8):623-7.

Hofheinz et al., Synthesizing arbitrary quantum states in a superconducting resonator. Nature. May 28, 2009;459:546-9. doi: 10.1038/nature08005. Supplementary Information. 6 pages.

Houck et al., Life after charge noise: recent results with transmon qubits. Quantum Info Process. Feb. 11, 2009;8(2-3):105-15.

Hover et al., High fidelity qubit readout with the superconducting lowinductance undulatory galvanometer microwave amplifier. Appl Phys Lett. 2014;104;152601.1-4.

Hover et al., Superconducting Low-inductance Undulatory Galvanometer Microwave Amplifier. Appl Phys Lett. Feb. 7, 2012;100:063503.1-3.

Johnson et al., Dispersive readout of a flux qubit at the single photon level. Phys Rev B. 2011;84:220503. arXiv:1109.2858v2. 5 pages.

Kamal et al., Gain, directionality, and noise in microwave SQUID amplifiers: Input-output approach. Phys Rev B. 2012;86:144510.1-12. doi: 10.1103/PhysRevB.86.144510.

Kamal et al., Noiseless nonreciprocity in a parametric active device. Nature Physics. 2011;7:311-315.

Kamal et al., Signal-to-pump back action and self-oscillation in double-pump Josephson parametric amplifier. Phys. Rev. B. May 13, 2009;79:184301.

Kerckhoff et al., On-chip superconducting microwave circulator from synthetic rotation. Phys Rev Appl. 2015;4:034002. arXiv:1502.06041. Submitted Feb. 21, 2015. 13 pages.

Kirchmair et al., Observation of quantum state collapse and revival due to the single-photon Kerr effect. Nature. Mar. 14, 2013;495:205-9. doi: 10.1038/nature11902.

Knill et al., Theory of Quantum Error Correction for General Noise. Phys Rev Lett. Mar. 13, 2000;84(11):2525-8. arXiv:quant-ph/9908066v1. 6 pages.

Koch et al., Time-reversal symmetry breaking in circuit-QED based photon lattices. arXiv:1006.0762v2. Oct. 11, 2010. 19 pages.

Krastanov et al., Universal Control of an Oscillator with Dispersive Coupling to a Qubit. Phys Rev A. 2015;92:040303. arXiv:1502.08015. Submitted Feb. 27, 2015. 5 pages.

Lähteenmäki et al., Advanced Concepts in Josephson Junction Reflection Amplifiers. Journal of Low Temperature Physics. 2014;175(5-6):868-76.

Leghtas et al., Confining the state of light to a quantum manifold by engineered two-photon loss. Dec. 16, 2014. arXiv:1412.4633v1. 29 pages.

Lidar et al., Decoherence Free Subspaces for Quantum Computation. Phys Rev Lett. Sep. 21, 1998;81(12):2594-7. arXiv:quant-ph/9807004v2. 4 pages.

Lindblad, On the generators of quantum dynamical semigroups. Commun Math Phys. 1976;48(2):119-30.

Liu et al., Comparing and combining measurement-based and driven-dissipative entanglement stabilization. Phys. Rev. X. 2016;6:011022.

Macleod et al., Periodicity in Al/Ti superconducting single electron transistors. App Phys Lett. Aug. 3, 2009;95:052503.

Martinis et al., Calculation of Tc in a normal-superconductor bilayer using the microscopic-based Usadel theory. Nucl Instrum Methods Phys Res A. 2000;444(1)2:23-27.

Martinis et al., Energy decay in superconducting Josephson-Junction qubits from nonequilibrium quasiparticle excitations. Phys Rev Lett. 2009;103(9):097002.

Metelmann et al., Nonreciprocal photon transmission and amplification via reservoir engineering. Phys. Rev. X. 2015(5):021025.

Minev et al., Planar Superconducting Whispering Gallery Mode Resonators. Appl Phys Lett. Oct. 3, 2013;103:142604.1-3. doi: 10.1063/1.4824201.

Mirrahimi et al., Dynamically protected cat-qubits: a new paradigm for universal quantum computation. New J Phys. Apr. 22, 2014;16:045014. 31 pages.

Mirrahimi, Cat-qubits for quantum computation. Comptes Rendus Physique. Aug. 1, 2016;17(7):778-87.

Mousolou et al., Universal non-adiabatic holonomic gates in quantum dots and single-molecule magnets. New J Phys. Jan. 17, 2014;16:013029. 10 pages.

Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.

Murch et al., Observing single quantum trajectories of a superconducting quantum bit. Nature. Oct. 10, 2013;502(7470):211-4. doi: 10.1038/nature12539.

Mutus et al., Design and characterization of a lumped element single-ended superconducting microwave parametric amplifier with on-chip flux bias line. App Phys Lett. Sep. 17, 2013;103:122602.

Narla et al., Robust concurrent remote entanglement between two superconducting qubits. Phys Rev X. 2016;6:031036.

Narla et al., Wireless Josephson amplifier. Appl Phys Lett. 2014;104:232605. doi: 10.1063/1.4883373. 6 pages.

Nsanzineza et al., Trapping a single vortex and reducing quasiparticles in a superconducting resonator. Phys Rev Lett. Sep. 12, 2014;113(11):117002. Epub Sep. 12, 2014.

O'Brien et al., Resonant Phase Matching of Josephson Junction Traveling Wave Parametric Amplifiers. Phys Rev Lett. Oct. 10, 2014;113:157001.1-5.

Ofek et al., Demonstrating quantum error correction that extends the lifetime of quantum information. Nature. 2016;536:441-445.

(56) References Cited

OTHER PUBLICATIONS

Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501.arXiv:1105.4652v4. 5 pages.
Paz-Silva et al., Zeno Effect for Quantum Computation and Control. Phys Rev Lett. Feb. 24, 2012;108(8):080501. arXiv: 1104.5507v2. 7 pages.
Peltonen et al., Magnetic-field-induced stabilization of nonequilibrium superconductivity in a normal- metal/insulator/superconductor junction. Phys Rev B. 2011;84(22):220502.
Pillet et al., Optimal design for the Josephson mixer. Mar. 30, 2015. arXiv:1503.08185v1. 5 pages.
Pillet, Amplification, entanglement and storage of microwave radiation using superconducting circuits. University of Virginia. Seminar. 2014;1-78.
Platenberg, Coupled superconducting flux qubits. Delft University of Technology. Thesis. 2007. 153 pages.
Pop et al., Coherent suppression of electromagnetic dissipation due to superconducting quasiparticles. Nature. Apr. 17, 2014;508(7496):369-72. doi: 10.1038/nature13017.
Ranzani et al., Graph-based analysis of nonreciprocity in coupled-mode systems. New J Phys. Oct. 15, 2014;17:023024. arXiv 2014;1406.4922v2. 21 pages.
Reed et al., Entanglement and Quantum Error Correction with Superconducting Qubits. Yale University Dissertation. Dec. 2013:1-368.
Rigetti et al., Superconducting qubit in a waveguide cavity with a coherence time approaching 0.1 ms. Phys Rev B. 2012;86:100506.
Ristè et al., Feedback Control of a Solid-State Qubit Using High-Fidelity Projective Measurement. Phys Rev Lett. Dec. 2012; 109(24):240502. arXiv:1207.2944v1 [cond-mat.mes- hall]. 9 pages.
Ristè et al., Millisecond charge-parity fluctuations and induced decoherence in a superconducting transmon qubit. Nat Commun. 2013;4:1913. doi: 10.1038/ncomms2936.
Roch et al., Observation of measurement-induced entanglement and quantum trajectories of remote superconducting qubits. Phys Rev Lett. May 2, 2014;112:170501.1-5.
Roch et al., Widely Tunable, Non-degenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Sarandy et al., Abelian and non-Abelian geometric phases in adiabatic open quantum systems. Phys Rev A. Jun. 2006; 73(6):062101. arXiv:quant-ph/0507012v3. 10 pages.
Schackert et al., A Practical Quantum-Limited Parametric Amplifier Based on the Josephson Ring Modulator. A Dissertation Presented to the Faculty of the Graduate School of Yale University in Candidacy for the Degree of Doctor of Philosophy. Dec. 2013. 182 pages.
Schackert et al., Phase-preserving amplification near the quantum limit with a Josephson ring modulator. Nature. May 2010;465(7294):64-8. arXiv:0912.3407v1. 20 pages.
Schindler et al., Quantum simulation of open-system dynamical maps with trapped ions. Nature Phys. May 19, 2013;9:361-7. arXiv:1212.2418v1. 28 pages.
Segall et al., Dynamics and energy distribution of nonequilibrium quasiparticles in superconducting tunnel junctions. Physical Review B. 2004;70(21):214520.

Shafer, Balanced Amplifier IP3 Improvement. Wayback Machine archive of RF Café, first saved Dec. 5, 2008. https://web.archive.org/web/20081205031826/www.rfcafe.com/references/electrical/balanced- amplifier-ip3-improvement.htm, 2 pages.
Shankar et al., Autonomously stabilized entanglement between two superconducting quantum bits. Nature. Dec. 19, 2013;504(7480):419-22. doi:10.1038/nature12802. Epub Nov. 24, 2013.
Shaw et al., Kinetics of nonequilibrium quasiparticle tunneling in superconducting charge qubits. Phys Rev B. Jul. 1, 2008;78:024503.
Siddiqi et al., An RF-Driven Josephson Bifurcation Amplifier for Quantum Measurements. Phys Rev Lett. Nov. 10, 2004;93:207002. arXiv:cond-mat/0312623v1. 4 pages.
Silveri et al., Theory of remote entaglement via quantum limited phase-preserving amplification. Phys Rev A. Jun. 7, 2016;93:062310.
Sirois et al., Coherent-state storage and retrieval between superconducting cavities using parametric frequency conversion. Appl Phys Lett. Apr. 30, 2015;106:172603.
SJÖQVIST, Trends: A new phase in quantum computation. Phys. 2008;1:35. doi: 10.1103/Physics.1.35. 6 pages.
Sliwa et al., Reconfigurable Josephson Circulator/Directional Amplifier. Phys. Rev. X 2015;5:041020.
Smith et al., Low noise microwave parametric amplifier. IEEE Transactions on Magnetics. Mar. 1985;MAG-21(2):1022-8.
Spietz et al., Input Impedance and Gain of a Gigahertz Amplifier Using a DC Squid in a Quarter Wave Resonator. Appl Phys Lett. Jun. 17, 2008;93:082506. arXiv:0806.2853v1.4 pages.
Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.
Sun et al., Tracking photon jumps with repeated quantum non-demolition parity measurements. Nature. Jul. 24, 2014;511(7510):444-8. doi: 10.1038/nature13436. Epub Jul. 13, 2014.
Swenson et al., High-speed phonon imaging using frequency-multiplexed kinetic inductance detectors,. App Phys Lett. Jul. 1, 2010; 96:263511.
Touzard et al., Gated conditional displacement readout of superconducting qubits. Physical review letters. Feb. 25, 2019;122(8):080502.
Usadel, Generalized Diffusion Equation for Superconducting Alloys. Phys Rev Lett. 1970;25(8):507.
Vijay et al., Invited Review Article: The Josephson bifurcation amplifier. Rev Sci Instrum. Nov. 17, 2009;80:111101. doi:10.1063/1.3224703.
Vijay et al., Observation of Quantum Jumps in a Superconducting Artificial Atom. Phys Rev Lett. Mar. 18, 2011;106(11):110502.1-4.
Vijay et al., Quantum feedback control of a superconducting qubit: Persistent Rabi oscillations. Nature. Oct. 4, 2012;490(7418):77-80. doi: 10.1038/nature11505.
Vion et al., Manipulating the quantum state of an electrical circuit. Science. May 3, 2002;296(5569):886-9.
Visser et al., Fluctuations in the electron system of a superconductor exposed to a photon flux. Nat Commun. 2014;5:3130. doi: 10.1038/ncomms4130.
Vool et al., Non-Poissonian quantum jumps of a fluxonium qubit due to quasiparticle excitations. Phys Rev Lett. Dec. 12, 2014;113(24):247001. Epub Dec. 8, 2014.
Wang et al., A Schrödiner cat living in two boxes. Science. May 27, 2016;352(6289):1087.
Wang et al., Measurement and control of quasiparticle dynamics in a superconducting qubit, Nature Comms. Dec. 18, 2014; 5:5836. doi:10.1038/ncomms6836.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond- mat/0508729v1. Aug. 30, 2005. 60 pages.
Wenner et al., Excitation of superconducting qubits from hot nonequilibrium quasiparticles. Phys Rev Lett. Apr. 12, 2013;110(15):150502. Epub Apr. 9, 2013.
Wu et al., Time-dependent decoherence-free subspace. J Phys A: Math. Theor. Sep. 19, 2012;45(40):405305. arXiv: 1205.1298v2. 7 pages.

(56) References Cited

OTHER PUBLICATIONS

Xu et al., Non-Adiabatic Holonomic Quantum Computation in Decoherence-Free Subspaces. Phys Rev Lett. Oct. 24, 2012;109(17):170501. arXiv:1210.6782v1. 4 pages.

Xu et al., Universal Nonadiabatic Geometric Gates in Two-Qubit Decoherence-Free Subspaces. Sci Rep. Oct. 29, 2014;4:6814. doi: 10.1038/srep06814. 5 pages.

Yaakobi et al., Parametric amplification in Josephson junction embedded transmission lines. Phys Rev B. Apr. 1, 2013;87:144301. 1-9. doi: 10.1103/PhysRevB.87.144301.

Yamamoto et al., Flux-driven Josephson parametric amplifier. Appl Phys Lett. Jul. 2008;93:042510. doi:10.1063/1.2964182.

Yang et al., Ultrastrong-coupling quantum-phase-transition phenomena in a few-qubit circuit QED system. Physical Review A. Apr. 14, 2017;95(4):043823.

Zanardi et al., Coherent quantum dynamics in steady-state manifolds of strongly dissipative systems. Phys Rev Lett. Dec. 17, 2014;113:240406. arXiv:1404.4673. 6 pages.

Zanardi et al., Geometry, robustness, and emerging unitarity in dissipation-projected dynamics. Phys Rev A. 2015;91:052324. arXiv:1412.6198. 8 pages.

Zanardi et al., Holonomic Quantum Computation. Phys Lett A. Nov. 15, 1999;264:94-9. 5 pages.

Zanardi et al., Noiseless Quantum Codes. Phys Rev Lett. Oct. 27, 1997;79(17):3306-9. arXiv:quant-ph/9705044v2. 4 pages.

Zanardi, Stabilizing Quantum Information. Phys Rev A. Dec. 5, 2000;63(1):012301. arXiv:quant-ph/9910016v2. 5 pages.

Zanardi, Virtual Quantum Subsystems. Phys Rev Lett. Aug. 13, 2001;87(7):077901. arXiv:quant-ph/0103030v2. 4 pages.

Zhang et al., Physical implementation of holonomic quantum computation in decoherence-free subspaces with trapped ions. Phys Rev A. 2006;74:034302. arXiv:quant-ph/0608068v1. 4 pages.

Zheng, Dissipation-induced geometric phase for an atom in cavity QED. Phys Rev A. May 10, 2012;85(5):052106. arXiv:1205.0984v2. 7 pages.

Zheng, Open-system geometric phase based on system-reservoir joint state evolution. Phys Rev A. Jun. 27, 2014;89:062118. arXiv:1405.1227v1. 8 pages.

Zhong et al., Squeezing with a flux-driven Josephson parametric amplifier. New J Phys. Dec. 2013; 15:125013. doi:10.1088/1367-2630/15/12/125013.

Zhou et al., High-gain weakly nonlinear flux-modulated Josephson parametric amplifier using a SQUID array. Physical Review B. 2014;89(21). 6 pages.

Zhu et al., Geometric quantum gates robust against stochastic control errors. Phys Rev A. Aug. 15, 2005;72(2):020301. arXiv:quant-ph/0407177v1. 4 pages.

Zorin, Josephson Traveling-Wave Parametric Amplifier with Three-Wave Mixing. Phys Rev Applied. Sep. 12, 2016;6:034006.

Zueco et al., Qubit-oscillator dynamics in the dispersive regime: analytical theory beyond the rotating-wave approximation. Physical Review A 80.3 2009. 6 pages.

\* cited by examiner

JOSEPHSON NONLINEAR CIRCUIT

CROSS-REFERENCE TO RELATED APPLICATIONS

The present application claims the benefit under 35 U.S.C. § 119(e) of U.S. Provisional Patent Application No. 62/793,850, filed Jan. 17, 2019, and titled "JOSEPHSON NONLINEAR CIRCUIT," which is hereby incorporated by reference in its entirety. The present application claims the benefit under 35 U.S.C. § 119(e) of U.S. Provisional Patent Application No. 62/812,714, filed Mar. 1, 2019, and titled "JOSEPHSON NONLINEAR CIRCUIT," which is hereby incorporated by reference in its entirety.

FEDERALLY SPONSORED RESEARCH

The present application is a national stage filing under 35 U.S.C. 371 of International Patent Application Serial No. PCT/US2020/013675, filed Jan. 15, 2020, entitled "JOSEPHSON NONLINEAR CIRCUIT ", which claims the benefit under 35 U.S.C. § 119(e) of U.S. Provisional Patent Application No. 62/793,850, filed Jan. 17, 2019, and titled "JOSEPHSON NONLINEAR CIRCUIT," which is hereby incorporated by reference in its entirety. The present application also claims the benefit under 35 U.S.C. § 119(e) of U.S. Provisional Patent Application No. 62/812,714, filed Mar. 1, 2019, and titled "JOSEPHSON NONLINEAR CIRCUIT,". The contents of these applications are hereby incorporated by reference in their entirety.

BACKGROUND

Quantum information processing uses quantum mechanical phenomena, such as energy quantization, superposition, and entanglement, to encode and process information in a way not utilized by conventional information processing. For example, it is known that certain computational problems may be solved more efficiently using quantum computation rather than conventional classical computation. However, to become a viable computational option, quantum computation requires the ability to precisely control a large number of quantum bits, known as "qubits," and the interactions between these qubits. In particular, qubits should have long coherence times, be able to be individually manipulated, be able to interact with one or more other qubits to implement multi-qubit gates, be able to be initialized and measured efficiently, and be scalable to large numbers of qubits.

A qubit may be formed from any physical quantum mechanical system with at least two orthogonal states. The two states of the system used to encode information are referred to as the "computational basis." For example, photon polarization, electron spin, and nuclear spin are two-level systems that may encode information and may therefore be used as a qubit for quantum information processing. Different physical implementations of qubits have different advantages and disadvantages. For example, photon polarization benefits from long coherence times and simple single qubit manipulation, but suffers from the inability to create simple multi-qubit gates.

Different types of superconducting qubits using Josephson junctions have been proposed, including "phase qubits," where the computational basis is the quantized energy states of Cooper pairs in a Josephson Junction; "flux qubits," where the computational basis is the direction of circulating current flow in a superconducting loop; and "charge qubits," where the computational basis is the presence or absence of a Cooper pair on a superconducting island. Superconducting qubits are an advantageous choice of qubit because the coupling between two qubits is strong making two-qubit gates relatively simple to implement, and superconducting qubits are scalable because they are mesoscopic components that may be formed using conventional electronic circuitry techniques. Additionally, superconducting qubits exhibit excellent quantum coherence and a strong non-linearity associated with the Josephson effect. All superconducting qubit designs use at least one Josephson junction as a non-linear non-dissipative element.

Scalable quantum computation will ultimately require precise control over the various components used to implement quantum computation, including the qubits and the devices used to implement logical gates between qubits.

SUMMARY

The following is a non-limiting summary of some embodiments of the present application.

Some aspects of the present application are directed to a nonlinear superconducting circuit. The circuit may include a first nonlinear superconducting device with a potential having a positive anharmonicity and a second nonlinear superconducting device coupled to the first nonlinear superconducting device. The second nonlinear superconducting device may have a potential with a negative anharmonicity, and a resonant frequency of the first nonlinear superconducting device may be equal to a resonant frequency of the second nonlinear superconducting device.

Some aspects of the present application are directed to a method of controlling a nonlinear superconducting circuit comprising a first nonlinear superconducting device and a second nonlinear superconducting device. The method includes: driving the first nonlinear superconducting device and the second nonlinear superconducting device to produce a Hamiltonian with least one off-diagonal interaction and diagonal interactions equal to zero.

BRIEF DESCRIPTION OF THE FIGURES

Various aspects and embodiments of the disclosed technology will be described with reference to the following figures. It should be appreciated that the figures are not necessarily drawn to scale.

DETAILED DESCRIPTION

Figure 1:
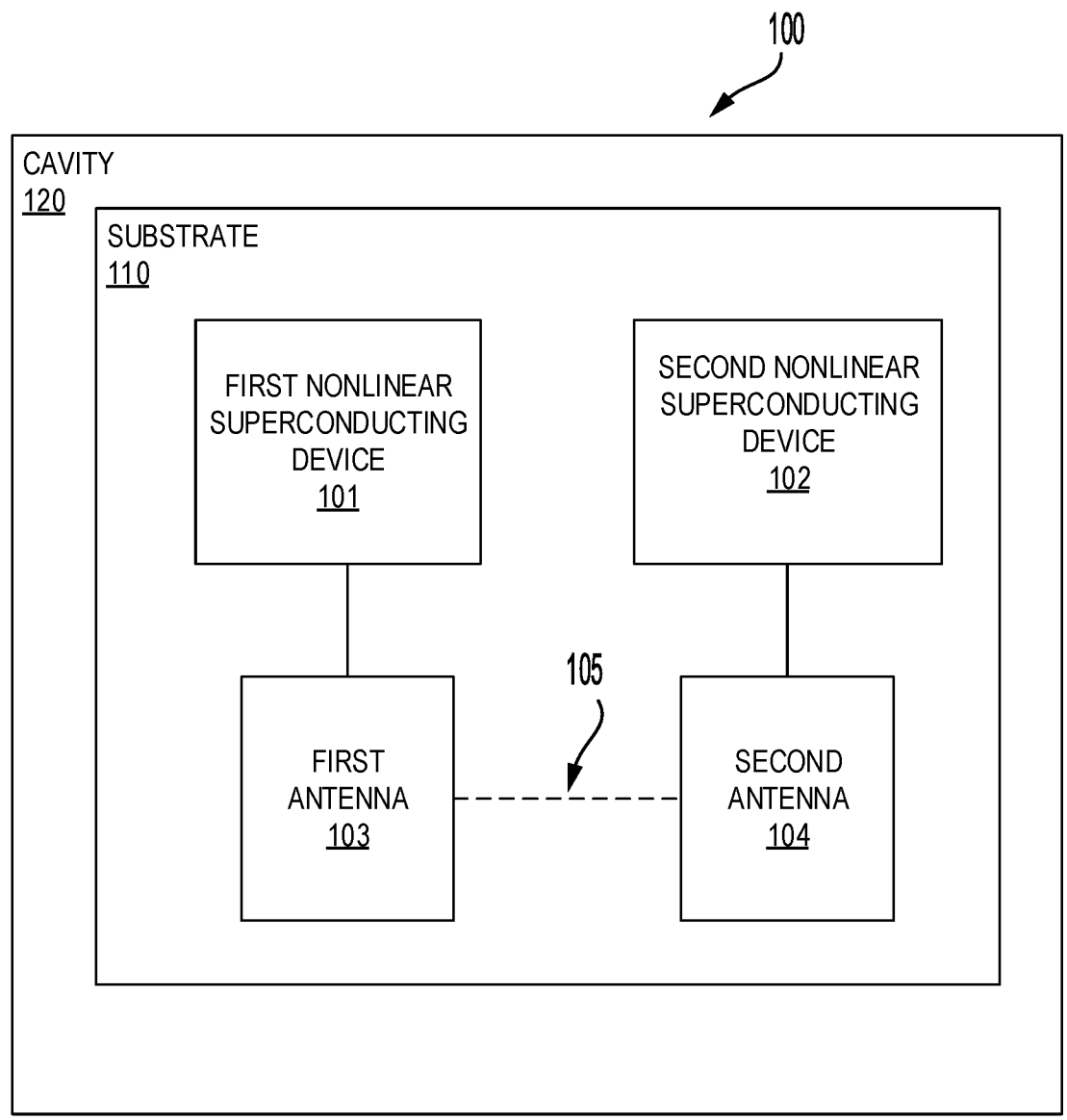
FIG. 1 is a block diagram of a nonlinear superconducting circuit, according to some embodiments.

The inventors have recognized and appreciated that four-wave mixing interactions are useful for controlling qubits used in quantum information processing and may be used as a building block for further developments in the field. In some embodiments, a Josephson junction based circuit facilitates off-diagonal parametric four-wave mixing interactions, while cancelling undesired diagonal interactions that arise from the fourth-order nonlinearity of the Josephson cosine potential. Some embodiments of the circuit consist of two capacitively coupled Josephson anharmonic oscillators tuned to have the same resonant frequencies while having equal and opposite fourth-order nonlinearity. The eigenmodes of such a system closely approximate linear harmonic oscillators with the additional ability to perform parametric four-wave mixing interactions. Moreover, for some applications, the magnitude of the diagonal terms can be tuned to non-zero values by changing the flux bias of the circuit.

Examples of uses of the four-wave mixing process in quantum information processing include exchanging two photons of a high-Q harmonic oscillator with a single excitation of a low-Q mode and a pump-photon, which may be used as a fundamental building block for driven-dissipative stabilization of Schrödinger cat-states (see, e.g., M. Mirrahimi et al., *New J. Phys.* 16, 045014, 2014, which is incorporated herein by reference in its entirety). Another example of a useful four-wave mixing process is a longitudinal interaction which induces qubit photon-number dependent drive on another mode, resulting in single-shot readout of the qubit (see, S. Touzard et al., *Phys. Rev. Lett.* 122, 080502, 2019, which is incorporated herein by reference in its entirety). These four-wave mixing processes are conventionally obtained by off-resonantly driving the fourth-order nonlinearity present in the cosine potential of a Josephson junction. However, using conventional techniques, the fourth-order nonlinearity also introduces additional diagonal interactions that manifest as frequency shifts, such as Kerr, cross-Kerr and Stark shifts etc. These frequency shifts lead to difficulties in tuning of the desired parametric processes and, for certain applications, limit the fidelities of the resulting operations.

By way of example, a transmon coupled to a cavity may be described by the following Hamiltonian:

$$H = \omega_c a^\dagger a + \omega_q b^\dagger b - E_J\left[\cos(\hat{\varphi}) + \frac{\hat{\varphi}}{2}\right]$$

where $\omega_c$ is the cavity frequency; $a$ and $a^\dagger$ are the annihilation and creation operators, respectively, for microwave radiation within the cavity; $\omega_q$ is the transmon qubit frequency; $b$ and $b^\dagger$ are the annihilation and creation operators, respectively, for transmon quanta; $E_J$ is the tunneling energy of the transmon's Josephson junction; and $\hat{\varphi}=\phi_a(a+a^\dagger)+\phi_b(b+b^\dagger)+\xi(t)$, where $\xi(t)=2\xi\cos(\omega_p t)$, wherein $\omega_p$ is a function of the frequency difference between twice the stark-shifted cavity frequency and the stark-shifted transmon qubit frequency. When the above Hamiltonian is expanded and put in a rotating frame, the resulting Hamiltonian is as follows:

$$H = -\chi_{ab}a^\dagger ab^\dagger b - \frac{\chi_{aa}}{2}a^{\dagger 2}a^2 - \frac{\chi_{bb}}{2}b^{\dagger 2}b^2 + g_{2ph}(a^2 b^\dagger + a^{\dagger 2}b),$$

where the first term is the cross-Kerr interaction between the cavity and the transmon qubit (with a coupling strength $\chi_{ab}$), the second term is the self-Kerr interaction in the cavity (with a coupling strength $\chi_{aa}$), the third term is the self-Kerr interaction in the transmon qubit (with a coupling strength $\chi_{bb}$), and the fourth term is the four-wave-mixing interaction (with a coupling strength $$g_{2ph} = \frac{\xi\chi_{ab}}{2}).$$

The self-Kerr and cross-Kerr interactions (i.e., the first three terms) shift the resonance frequencies and cause dephasing in a way that makes it difficult to precisely tune the desirable four-wave-mixing interaction. In addition, under certain circumstances, these interactions may lead to irretrievable loss of information.

The inventors have recognized that it is desirable to remove the aforementioned frequency shifts. Accordingly, in some embodiments, a Josephson junction based four-wave mixing circuit is used to take advantage of an interference effect that arises by engineering a particular symmetry to cancel out the undesired fourth-order diagonal interactions while preserving the four-wave mixing capabilities. In some embodiments, the circuit includes two capacitively coupled anharmonic oscillators, that are engineered and/or controlled to have the same frequencies, while making their fourth-order nonlinearity equal in magnitude but opposite in sign. This condition is described by a simplified Hamiltonian of the form $$\frac{H}{\hbar} = \omega_0 a^\dagger a + \omega_0 b^\dagger b + g(a^\dagger b + b^\dagger a) + g_4(a + a^\dagger)^4 - g_4(b + b^\dagger)^4,$$

where $\omega_0$ is the frequency of the two modes, g is the strength of the capacitive coupling, $g_4$ is the magnitude of the fourth-order nonlinearity at the operating point, a and $a^\dagger$ are the annihilation and creation operators of one of the two bare modes of the circuit, and b and $b^\dagger$ are the annihilation and creation operators the other of the two bare modes of the circuit. The bare modes of this circuit participate in the nonlinearity with equal and opposite amplitudes. This can be seen by diagonalizing the linear part $H_0/\hbar = \omega_0 a^\dagger a + \omega_0 b^\dagger b + g(a^\dagger b + b^\dagger a)$ of the Hamiltonian to get $$\frac{H_{diag}}{\hbar} = \omega_S S^\dagger S + \omega_A A^\dagger A + \frac{g_4}{4}(S + S^\dagger + A + A^\dagger)^4 - \frac{g_4}{4}(S + S^\dagger - A - A^\dagger)^4.$$

Here, the symmetric bare mode S ($\omega_S = \omega_0 + g$) participates in the nonlinearity symmetrically while the asymmetric bare mode A ($\omega_A = \omega_0 - g$) participates in the nonlinearity asymmetrically. By expanding the nonlinear terms, it can be seen that the self-Kerr terms and the cross-Kerr terms of the two eigenmodes vanish, leaving a completely harmonic system. The only nonlinear terms that survive are the off-diagonal terms that have an odd number of asymmetric mode participation (e.g., $S^3 A^\dagger$, $SA^2 A^\dagger$ etc.). These terms can then be addressed using off-resonant drives on appropriate modes.

The negative fourth-order nonlinearity mode can be engineered using any Josephson inductive element such as a single Josephson junction or a flux-tunable element such as SQUID, RF-SQUID, SNAIL etc. biased near zero flux quantum. On the other hand, the mode with positive fourth-order nonlinearity can only be engineered using an asymmetric flux-tunable element such as RF-SQUID, SNAIL (a.k.a. flux-qubit) etc., biased near half flux quantum. The conditions for making the two modes equal in frequency and equal-and-opposite in fourth-order nonlinearity can be derived based on the particular implementation chosen. In some embodiments this may be achieved by selecting the shunting capacitance of the individual bare modes to be equal.

In some embodiments, the circuit can also be coupled to other resonator/qubit modes using a capacitive dipole-dipole coupling. It is possible to selectively couple these external modes via only symmetric or only asymmetric eigenmodes by choosing the correct orientation of the circuit. The same technique can be applied to make the eigenmodes selectively high-Q or low-Q depending on their function. Moreover, the circuit can be configured, by tuning the flux bias, to provide a non-zero magnitude of diagonal interactions and/or to provide odd-order mixing processes.

In some embodiments, using an interference effect arising from a symmetric circuit design leads to a versatile device with the ability to may be used to engineer multimode systems that are useful in the field of quantum information processing, since eliminating the always on diagonal interactions makes it easier to address the individual modes while keeping the other modes unperturbed. Moreover, in certain applications, the diagonal interactions can be tuned to non-zero values by tuning the flux away from the ideal operating point. Additionally, some embodiments of the circuit use well-studied dipole inductive elements. This makes the implementation of some embodiments of the circuit straightforward and the parameter space easily accessible. Finally, in some embodiments, appropriate orientation of the circuit may be used to specifically couple to the chosen eigenmode, further increases the selectivity of engineered interactions.

FIG. 1 is a block diagram of a nonlinear superconducting circuit 100, according to some embodiments. The nonlinear superconducting circuit 100 includes at least a first nonlinear superconducting device 101, a second nonlinear superconducting device 102, a first antenna 103, a second antenna 104, a substrate 110, and a cavity 120. It should be appreciated that embodiments need not include all of the components shown in FIG. 1. For example, some embodiments may not include the cavity 120 and/or the antennas 103/104.

The first nonlinear superconducting device 101 is a nonlinear device that exhibits a positive anharmonicity. In some embodiments, a positive anharmonicity refers to the fourth order term of the potential having a positive, non-zero value. In some embodiments, the nonlinear device that exhibits a positive anharmonicity uses an external magnetic field to create the positive anharmonicity. For example, an external magnetic field may be threaded through a loop or ring of the nonlinear device. Some examples of nonlinear superconducting devices that are capable of exhibiting positive anharmonicity include superconducting nonlinear asymmetric inductive elements (SNAILs), fluxonium qubits, radio frequency (RF) superconducting quantum interference devices (SQUIDS), and capacitively-shunted flux qubits.

The second nonlinear superconducting device 102 is a nonlinear device that exhibits a negative anharmonicity. In some embodiments, a negate anharmonicity refers to the fourth order term of the potential having a negative, non-zero value. Some examples of nonlinear superconducting devices that are capable of exhibiting negative anharmonicity include SNAILs, transmons, and SQUID transmons.

In some embodiments, the first and second nonlinear superconducting devices 101/102 are manufactured to have the respective anharmonicity properties. Alternatively, the anharmonicity properties of the nonlinear superconducting devices may be controlled at the time of operation. This may be achieved, for example, by using nonlinear superconducting devices that include at least one loop and threading an external magnetic field through the at least one loop. In some embodiments, an electromagnetic solenoid may be positioned near the nonlinear superconducting devices such that the external magnetic field created by the solenoid is oriented in a direction that is substantially perpendicular to the plane of the at least one loop.

In some embodiments, the first and second nonlinear superconducting devices 101/102 comprise a superconducting material, such as aluminum formed on a substrate 110. The substrate 110 may, for example, be made from sapphire. In some embodiments, the first and second nonlinear superconducting devices 101/102 may be formed on the same substrate 110, as illustrated in FIG. 1. In other embodiments, the first nonlinear superconducting device 101 and the second nonlinear superconducting device 102 may be formed on two different substrates.

In some embodiments, the nonlinear superconducting circuit 100 includes the cavity 120. The cavity 120 may be, for example a three-dimensional (3D) resonator that supports one or more microwave frequencies. The substrate 110 on which the first and second superconducting devices 101/102 are formed may be suspended in the three-dimensional resonator. However, embodiments are not limited to 3D cavity resonators. Some embodiments use two-dimensional, planar superconducting resonators and circuits.

In some embodiments, the nonlinear superconducting circuit 100 includes a first antenna 103 and a second antenna 104. The first antenna 103 is coupled to the first nonlinear superconducting device 101. The first antenna 103 enables microwave signals supported by the cavity 120 to couple to the first nonlinear superconducting device 101. The second antenna 104 is coupled to the second nonlinear superconducting device 102. The second antenna 104 enables microwave signals supported by the cavity 120 to couple to the second nonlinear superconducting device 102. In some embodiments, the first antenna 103 and the second antenna 104 are formed on the same substrate 110 as the first and second nonlinear superconducting device 101/102, as illustrated in FIG. 1. In other embodiments, the first antenna 103 and the first nonlinear superconducting device 101 are formed on a first substrate and the second antenna 104 and the second nonlinear superconducting device 101 are formed on a second substrate that is different from the first substrate.

In some embodiments, the first and second antenna 103/104 may each include multiple portions. For example, a first portion of the first antenna 103 may be located on a first side of the first nonlinear superconducting device 101 and the second portion of the first antenna 103 may be located on a second side, opposite the first side, of the first nonlinear superconducting device 101. In this way, the first portion and the second portion of the first antenna 103 may be connected to opposite sides of the first nonlinear superconducting device. Similarly, a first portion and a second portion of the second antenna may be connected to opposite sides of the second nonlinear superconducting device.

In some embodiments, the first and second antennas 103/104 may include a superconducting pad formed from the same superconducting material (e.g., aluminum) as is used to form the first and second nonlinear superconducting devices 101/102.

In some embodiments, a portion of the first antenna 103 is physically connected to a portion of the second antenna 104 by a superconducting connecting member 105. In some embodiments, the superconducting connecting member 105 may be a wire of superconducting material formed on the substrate 110.

Figure 2A:
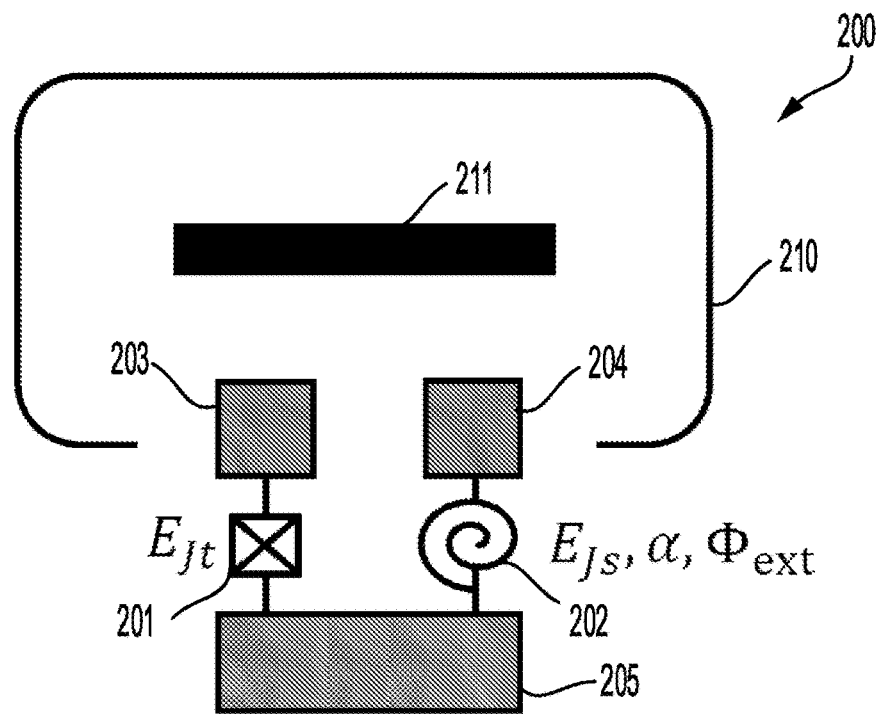
FIG. 2A is a schematic diagram of a nonlinear superconducting circuit, according to some embodiments.
Figure 2B:
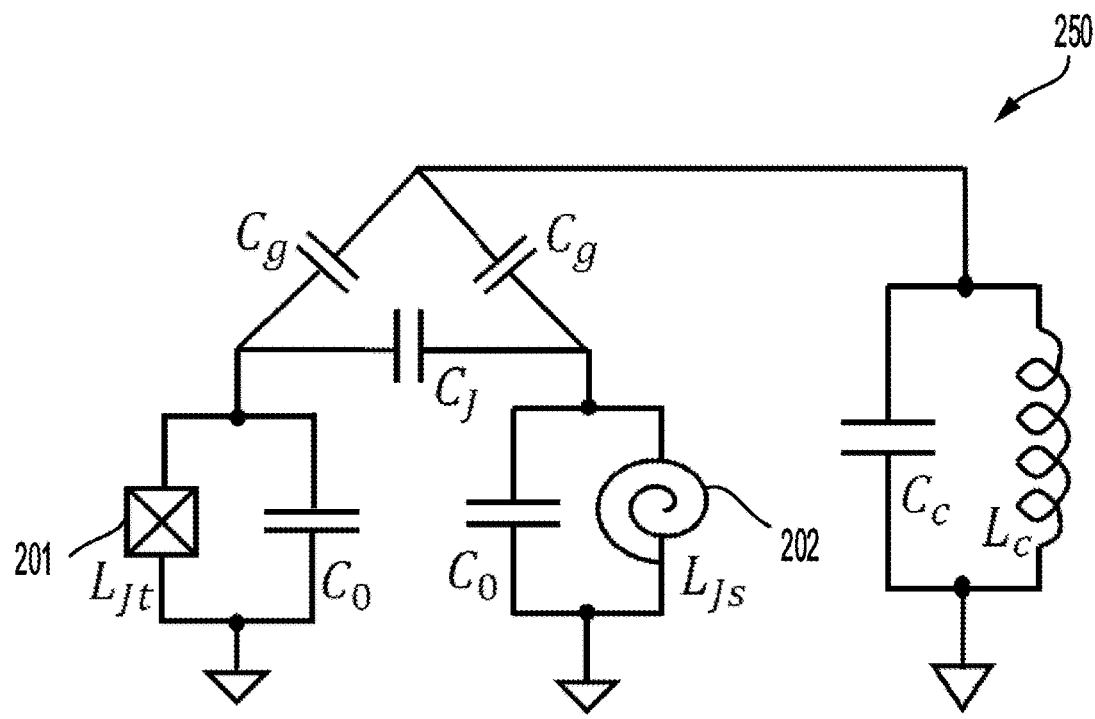
FIG. 2B is an equivalent circuit diagram of the nonlinear superconducting circuit of FIG. 2A.

FIG. 2A is a schematic diagram of a nonlinear superconducting circuit 200, according to some embodiments. The nonlinear superconducting circuit 200 includes a transmon 201 as the nonlinear superconducting device with a negative anharmonicity and a SNAIL 202 as the nonlinear superconducting device with a positive anharmonicity. A first antenna coupled to the transmon 201 is formed by a first antenna portion 203 and a second antenna portion 205. A second antenna coupled to the SNAIL 202 is formed by the second antenna portion 205 and a third antenna portion 204. The second antenna portion 205 is shared between the first antenna and the second antenna. FIG. 2B is an equivalent circuit diagram 250 of the nonlinear superconducting circuit 200.

Figure 3A:
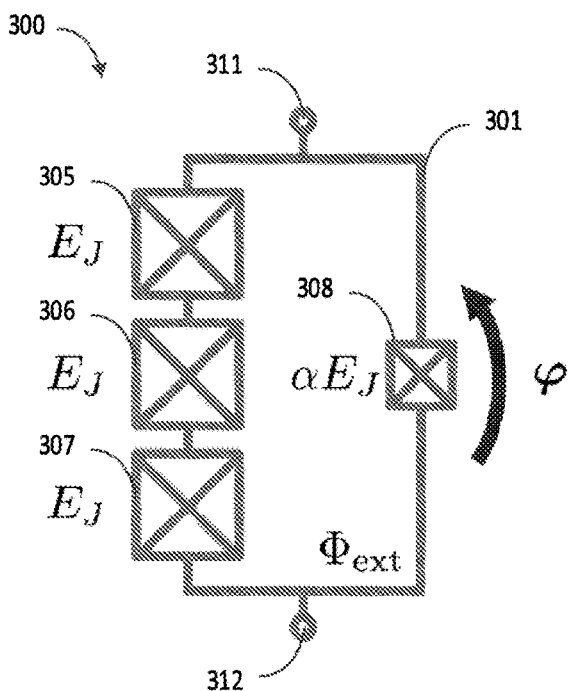
FIG. 3A is a schematic diagram of a superconducting nonlinear asymmetric inductive element (SNAIL) for use in the nonlinear superconducting circuit of FIG. 1, according to some embodiments.

FIG. 3A is a schematic diagram of a SNAIL 300 that may be used in the nonlinear superconducting circuits 100 or 200, according to some embodiments. The SNAIL 300 includes a superconducting ring 301 with two nodes 311 and 312. There are two path along two different portions of the superconducting ring 301 that connect the first node 331 and the second node 312.

The first ring portion includes multiple Josephson junctions 305-307 connected in series. In some embodiments, there are no other circuit elements between one Josephson junction and the next Josephson junction. For example, a Josephson junction is a dipole circuit element (i.e., it has two nodes). A first node of a first Josephson junction 305 is directly connected to the first node 311 of the SNAIL, which may lead to some other external circuit element (such as a portion of the antenna). A second node of the first Josephson junction 305 is directly connected to a first node of a second Josephson junction 306. A second node of the second Josephson junction 306 is directly connected to a first node of a third Josephson junction 307. A second node of the third Josephson junction 307 is directly connected to a second node 312 of the SNAIL, which may lead to some other external circuit element (such as a portion of the antenna).

While FIG. 3A illustrates the first ring portion including three Josephson junctions, any suitable number of Josephson junctions greater than one may be used. For example, three, four, five, six, or seven Josephson junctions may be used. Three Josephson junctions are selected for the example shown because three Josephson junctions is the lowest number of Josephson junctions (other than zero or one) that can be formed using a Dolan bridge process of manufacturing, which is used in some embodiments.

In some embodiments, Josephson junctions 305-307 are formed to be identical. For example, the tunneling energies, the critical current, and the size of the Josephson junctions 305-307 are all the same.

The second ring portion of the SNAIL 300 includes a single Josephson junction 308. In some embodiments, there are no other circuit elements in the second ring portion. A first node of a single Josephson junction 308 is directly connected to the first node 311 of the SNAIL, which may lead to some other external circuit element (such as a portion of the antenna). A second node of the single Josephson junction 308 is directly connected to the second node 312 of the SNAIL, which may lead to some other external circuit element (such as a portion of the antenna).

The single Josephson junction 308 has a smaller tunneling energy than each of Josephson junctions 305-307. For this reason, the single Josephson junction 308 may be referred to as a "small" Josephson junction and Josephson junctions 305-307 may be referred to as "large" Josephson junctions. The terms "large" and "small" are relative terms that are merely used to label the relative size of Josephson junction 308 as compared to Josephson junctions 305-307. The Josephson energy and the Josephson junction size are larger in the large Josephson junction than in the small Josephson junction. The parameter $\alpha$ is introduced to represent the ratio of the small Josephson energy to the large Josephson energy. Thus, the Josephson energy of the large Josephson junctions 305-307 is $E_1$ and the Josephson energy of the small Josephson junction 108 is $\alpha E_J$, where $0<\alpha<1$.

Figure 3B:
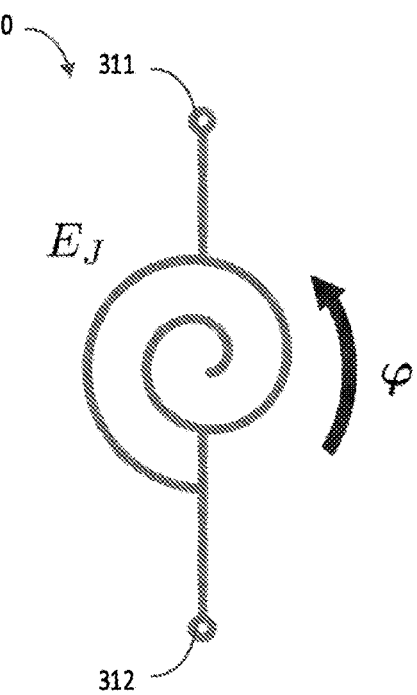
FIG. 3B illustrates the circuit element symbol for the SNAIL of FIG. 3A.

FIG. 3B illustrates the circuit element symbol for the SNAIL 300. The parameters that characterize the SNAIL 300 are the Josephson energy $E_J$ and the superconducting phase difference, $\varphi$, of the small Josephson junction 308. Of note is the fact that the SNAIL 300 has only two nodes 311 and 312.

Figure 3C:
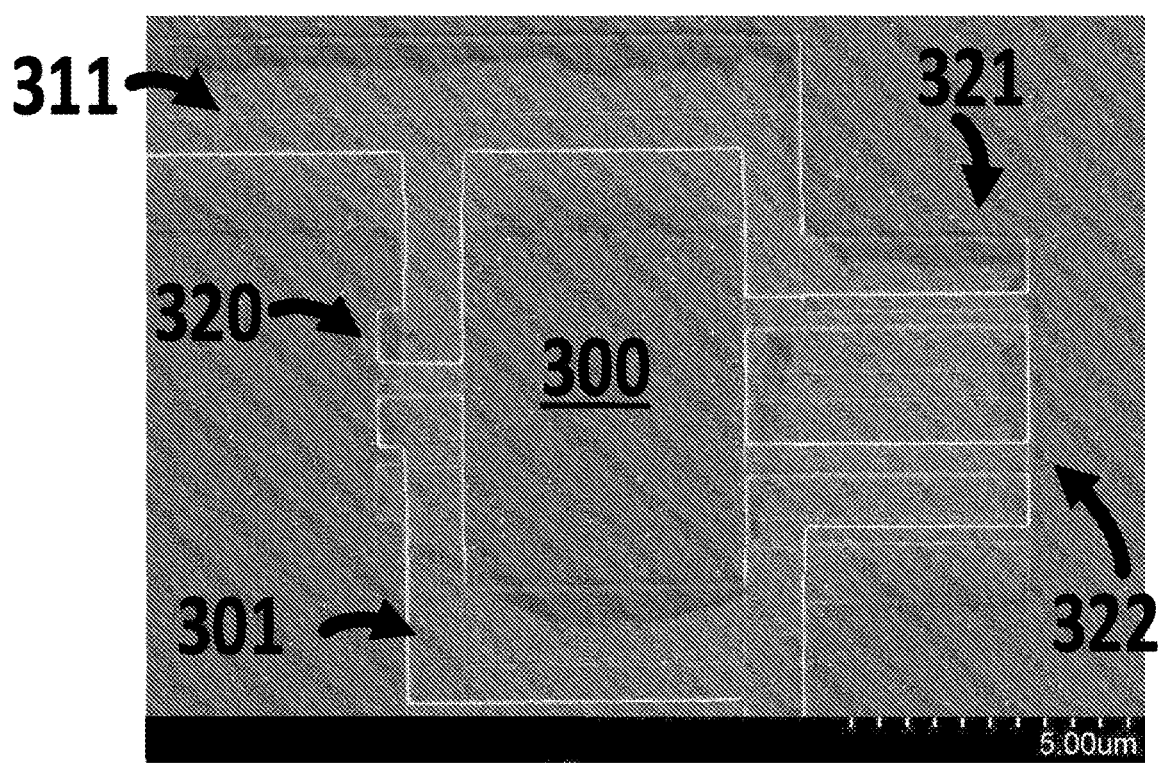
FIG. 3C is a scanning electron microscope image of a SNAIL, according to some embodiments.

FIG. 3C is a scanning electron microscope image of an example SNAIL 300. The image in FIG. 3C is a mirror image of the SNAIL 300 shown in FIG. 3A. In other words, the single small Josephson junction is on the left side in FIG. 3A, not the right side as it is in FIG. 3A. The single small Josephson junction is formed using a single Dolan bridge 320. The three large Josephson junctions 305-307 are formed from a first Dolan bridge 321 and a second Dolan bridge 322. The Dolan bridge fabrication technique has the advantage of being able to reliably fabricate junctions with particular parameters while only requiring a single double-angle evaporation act. If N Dolan bridges are formed in series, 2N−1 Josephson junctions are formed. This is because junctions are formed underneath each bridge and between adjacent bridges. Thus, the simplest way to form a plurality of Josephson junctions using Dolan bridges is to form two Dolan bridges.

The SNAIL 300 may controlled at least in part by threading a DC magnetic flux $\Phi_{ext}$ through the superconducting ring 301. In some embodiments, a magnetic flux generation device (not shown) may be positioned in proximity to the superconducting ring. For example, an electrical coil (e.g., a solenoid) may be formed in proximity to the ring 101. The coil may be next to the ring 101 and in the same plane as ring 101. Alternatively, a coil may be under the ring 101 in a different layer of the device 100, e.g., above or below the plane of the superconducting ring 301.

As mentioned above, any number of large Josephson junctions may be used in the SNAIL 300. For a SNAIL with n large Josephson junctions, the SNAIL has an inductive energy given by:

$$U_{SNAIL}(\varphi) = -\alpha E_J \cos(\varphi) - nE_J \cos\left(\frac{\varphi_{ext} - \varphi}{n}\right), \quad \text{(Eqn. 1)}$$

where $\varphi$ is the superconducting phase across the single small Josephson junction 108, $\varphi_{ext}=2\pi\Phi_{ext}/\Phi_0$ is the reduced applied magnetic flux, and $\Phi_0=h/2e$ is the magnetic flux quantum. Eqn. 1 indicates that the potential is a function of a single degree of freedom ($\varphi$). This is because dynamics due to any intra-array modes are eliminated and only common excitations across the array of n Josephson junctions are considered. This reduction is valid when $E_J \gg E_C$ for each junction, where $E_C=e^2/2C_J$ is the Coulomb charging energy of the junction with capacitance $C_J$, and when $C_0 \ll C_J/n^2$, where $C_0$ is the capacitance to ground of each island between junctions. Some embodiments meet all of these requirements.

In some embodiments, the parameters $\alpha$ and $\Phi_0$ may be selected such that the SNAIL 300 has properties desirable for its application. For example, for $\alpha \sim 0.8$ and $\Phi_{ext} \sim 0.5\Phi_0$, the SNAIL 300 will have a double-well potential, which is undesirable due to the resulting hysteresis affects. But the parameters can be adjusts to create a potential with a single minimum. Moreover, the potential may simultaneously be tuned to have a positive anharmonicity in the fourth-order term (e.g., for $\alpha \sim 0.2$ and $\Phi_{ext} \sim 0.4\Phi_0$).

To select desirable parameters, the potential of Eqn. 1 is Taylor expanded about its minimum value $O_{min}$ to obtain the effective potential for $\tilde{\varphi} = \varphi - \varphi_{min}$:

$$\frac{U_{eff}(\tilde{\varphi})}{E_J} = c_2\tilde{\varphi}^2 + c_3\tilde{\varphi}^3 + c_4\tilde{\varphi}^4 + \ldots, \quad \text{Eqn. (2)}$$

where ($c_2, c_3, c_4, \ldots$) are numerically determinable coefficients whose specific values depend on n (which is three in the illustrated embodiments), $\alpha$, and $\Phi_{ext}$.

It is noted that for n=1 (e.g., a SQUID) $c_3=0$ because the potential is a pure cosine irrespective of the values of $\alpha$, and $\Phi_r$. Additionally, in the limit $n \gg 1$, the array of multiple large Josephson junctions act as a linear inductance and the potential approaches that of a fluxonium qubit/RF SQUID regime. While embodiments may include any number of large Josephson junctions so long as n>1 and the number is not in the regime where $n \gg 1$, the example described herein is focused on the case where n=3. Embodiments are not however, limited to this example embodiment.

Figure 4A:
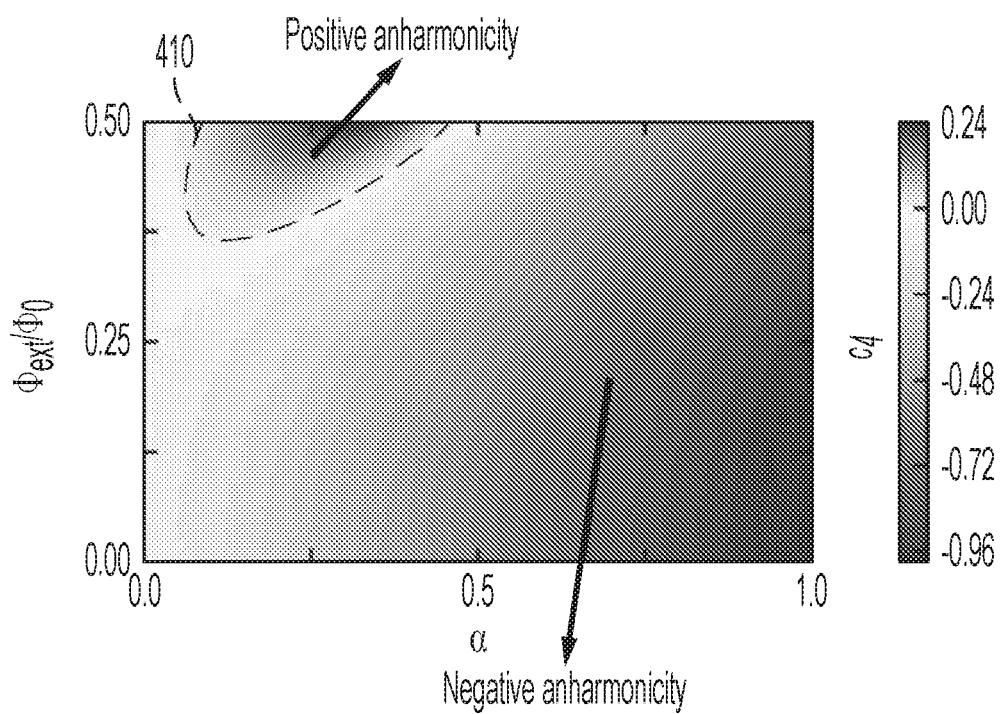
FIG. 4A is a greyscale color map for the fourth-order phase term, $c_4$, of the potential of a SNAIL as a function of the parameter $\alpha$ and the external DC magnetic flux, $\Phi_{ext}$, according to some embodiments.
Figure 4B:
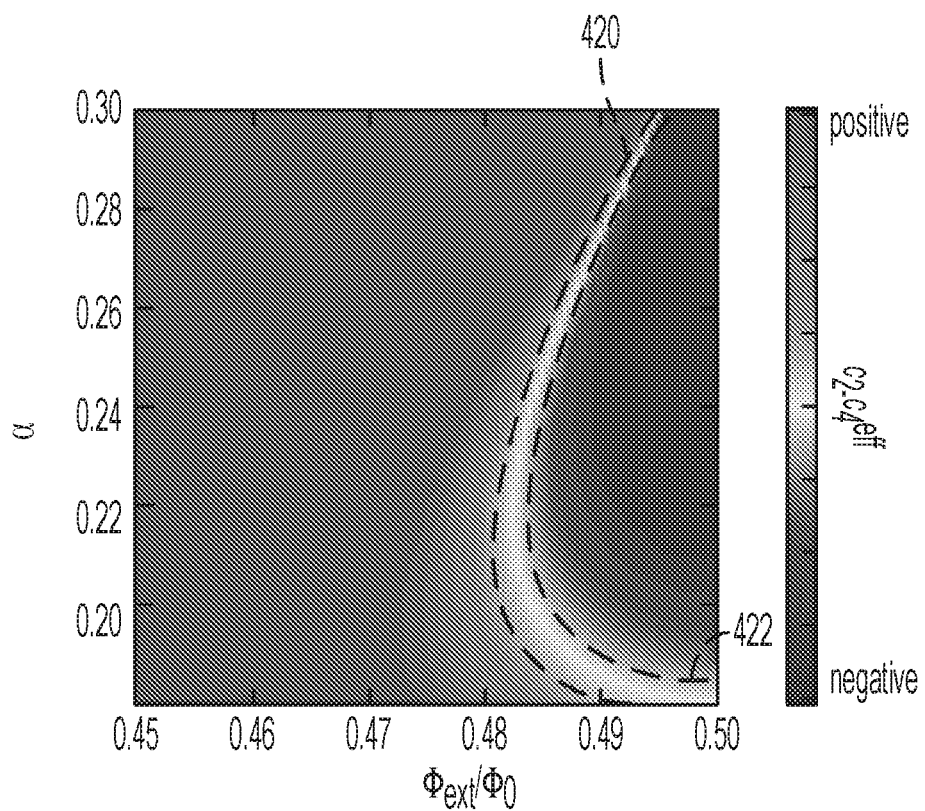
FIG. 4B is a greyscale color map for the difference between the second-order phase term, $c_2$ and the effective fourth-order phase term, $c_4^{\textit{eff}}$, of the potential of a SNAIL as a function of the parameter α and the external DC magnetic flux, $\Phi_{ext}$, according to some embodiments.

FIG. 4A is a greyscale color map for the fourth-order phase term, $c_4$, of the potential as a function of the parameter $\alpha$ and the external DC magnetic flux, $\Phi_{ext}$ for n=3. FIG. 4B is a greyscale color map for the difference between the second-order (quadratic) phase term, $c_2$, of the potential and the effective fourth-order (quartic) phase term, $c_4^{eff}$ as a function of the parameter $\alpha$ and the external DC magnetic flux, $\Phi_{ext}$ for n=3, where $$c_4^{eff} = c_4 - \frac{5c_3^2}{3c_2}$$

(the $c_3$ term is small, making the effective fourth-order phase term not too dissimilar from the actual fourth-order phase term). Thus, in some embodiments, a quartic coefficient of the potential of the SNAIL 300 is equal to a quadratic coefficient of the potential of the SNAIL 300. In some embodiments, the quartic coefficient is the aforementioned effective quartic coefficient, which is a function of the quadratic coefficient, the cubic coefficient and the actual quartic coefficient of the potential of the SNAIL 300.

These two maps of FIG. 4A-4B can be numerically searched to simultaneously obtain two desired criteria. This first criterion is for $c_4$ to be positive and non-zero, corresponding to the dark grey area encircled by line 410 in FIG. 4A. The second criterion is to have $c_4^{eff}=c_2$, which corresponds to the light area between lines 420 and 422 in FIG. 4B. In some embodiments, a may be restricted to 0<$\alpha$<0.50, 0.1<$\alpha$<0.50, 0.15<$\alpha$<0.40, 0.18<$\alpha$<0.34, or 0.185<$\alpha$<0.33. In some embodiments, a may be selected to be substantially equal to 0.18, 0.185, 0.2, or 0.33. In some embodiments, the external magnetic field, $\Phi_{ext}$, may be restricted to 0.4<$\Phi_{ext}$<0.50, 0.45<$\Phi_{ext}$<0.50, 0.47<$\Phi_{ext}$<0.50, or 0.48<$\Phi_{ext}$<0.50.

The above values may be of interest for a SNAIL with three Josephson junctions. In particular, the value of alpha may be 0.18<$\alpha$<0.33. However, other embodiments may use a SNAIL with a larger number of Josephson junctions. In an embodiment with N Josephson junctions, the range of interest may be between, and including, the values 1/N and ½(1/N+1/N³). However, embodiments are not limited to this particular range.

In addition to the above criteria, some embodiments have the SNAIL resonance frequency equal to the transmon resonance frequency. This requirement is equivalent to the inductance of the transmon ($L_{Jt}$) being equal to the inductance of the SNAIL ($L_{Js}$) (see FIG. 2B). In some embodiments, the SNAIL 300 resonance frequency may be tuned using the external magnetic flux through the superconducting ring 301 of the SNAIL 300.

Figure 5A:
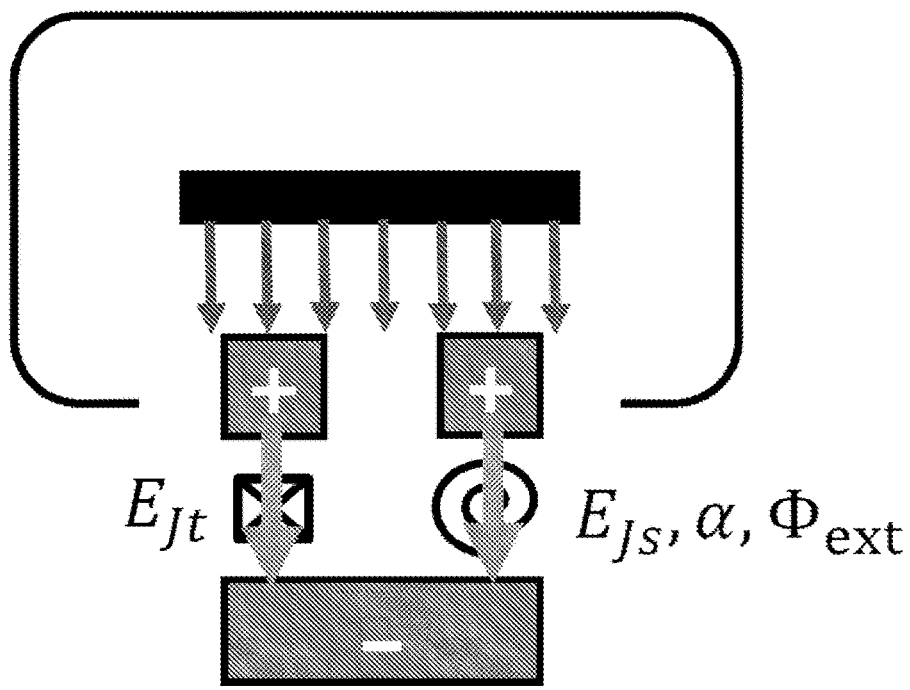
FIG. 5A is a schematic diagram illustrating the symmetric mode of a nonlinear superconducting circuit, according to some embodiments.
Figure 5B:
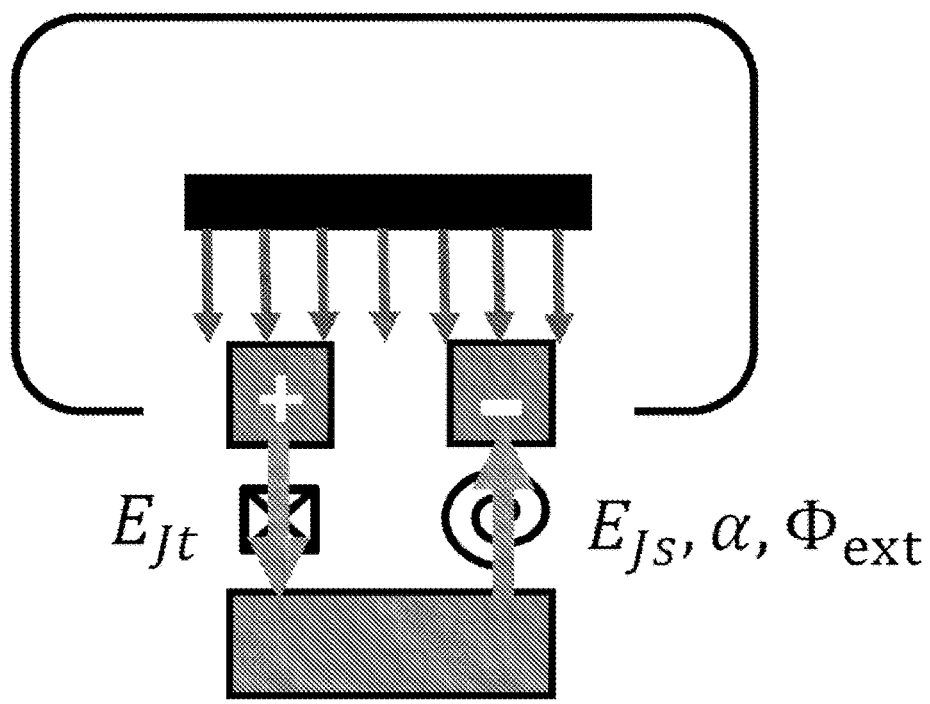
FIG. 5B is a schematic diagram illustrating the asymmetric mode of a nonlinear superconducting circuit, according to some embodiments.

When the above conditions are met, the nonlinear superconducting circuit 200 exhibits a symmetric mode and an asymmetric mode. FIG. 5A illustrates the symmetric mode of the nonlinear superconducting circuit 200, where the current through the transmon and the SNAIL occur in phase with the cavity excitation. FIG. 5B illustrates the asymmetric mode of the nonlinear superconducting circuit 200, wherein the current through the transmon is in phase with the cavity excitation and the current through the SNAIL is 180-degrees out-of-phase with the cavity excitation. Thus, the symmetric mode of FIG. 5A couples linearly with the cavity mode and the asymmetric mode of FIG. 5B does not couple linearly with the cavity mode. In some embodiments, this coupling can be switched such that the asymmetric mode of FIG. 5B couples linearly with the cavity mode and the symmetric mode of FIG. 5A does not couple linearly with the cavity mode.

The Hamiltonian of the superconducting circuit 200 written in terms of the symmetric and asymmetric eigenmodes is as follows:

$$H_{nl}=g_{4t}[\phi_S(S+S^\dagger)+\phi_A(A+A^\dagger)+\phi_C(C+C^\dagger)]^4+g_{4s}[\phi_S(S+S^\dagger)-\phi_A(A+A^\dagger)+\phi_C(C+C^\dagger)]^4$$

where S and $S^\dagger$ are the annihilation and creation operators, respectively, for the symmetric eigenmode of the circuit 200; A and $A^\dagger$ are the annihilation and creation operators, respectively, for the asymmetric eigenmode of the circuit 200; and C and $C^\dagger$ are the annihilation and creation operators, respectively, for the cavity mode of the circuit 200. In the above Hamiltonian, $g_{4t}=-E_{Jt}/4!\hbar$ and $g_{4s}=c_4E_{Js}/4!\hbar$. Thus, $g_{4t}$ and $g_{4s}$ have opposite signs. When the Hamiltonian is expanded, the self-Kerr and cross-Kerr terms are equal to zero when the condition $g_{4s}=-g_{4t}=g_4>0$. In some embodiments, $g_{4s}$ may be tuned using the external magnetic flux and/or the ratio α of the SNAIL. In some embodiments, $g_{4t}$ may be set at the time of manufacturing by setting the capacitance and/or size of the superconducting pads forming the antennas of the transmon and/or the critical current, $I_c$, of the transmon.

When the first condition ($L_s=L_t$) and the second condition ($g_{4s}=-g_{4t}=g_4>0$) are met, and the Hamiltonian is expanded, the terms with an odd number of $\phi_A$ will not cancel (due to the difference in signs in the asymmetric terms of the Hamiltonian), but all terms with an even number of $\phi_A$ do cancel. Thus, constructive interference results in only the following four-wave-mixing terms being non-zero:

$$\omega_p=2\omega_c-\omega_A \Rightarrow H_{eff}=24g_4\phi_C^2\phi_S\phi_A\xi(C^2A^\dagger+C^{\dagger 2}A)$$

$$\omega_p=\omega_A \Rightarrow H_{eff}=24g_4\phi_C^2\phi_S\phi_A\xi(2C^\dagger C)(A^\dagger+A)$$

Thus, by forming a nonlinear superconducting circuit with two nonlinear superconducting devices that satisfy the above two conditions, a pure four-wave-mixing interaction may be engineered without the negative influences of dephasing and frequency shifts caused be the self-Kerr and cross-Kerr interactions, which are canceled out due to the symmetry of the circuit.

The above discussion focuses on the example embodiment of FIG. 2 where a transmon and a SNAIL are used as the two nonlinear superconducting devices. However, embodiments are not so limited. As discussed above, there are a number of devices that may be used to exhibit positive anharmonicity and negative anharmonicity. In some embodiments, it may be desirable for both the first nonlinear superconducting device and the second nonlinear superconducting device to include a superconducting loop. By both devices including a superconducting ring such that both devices may be actively tuned using an external magnetic flux. In some embodiments the first nonlinear superconducting device and the second nonlinear superconducting device may include superconducting rings of different sizes/areas such that the effects of the external magnetic flux is different between the two devices, allowing for better tuning of the above parameters using a single magnetic flux source (e.g., a solenoid).

Figure 6A:
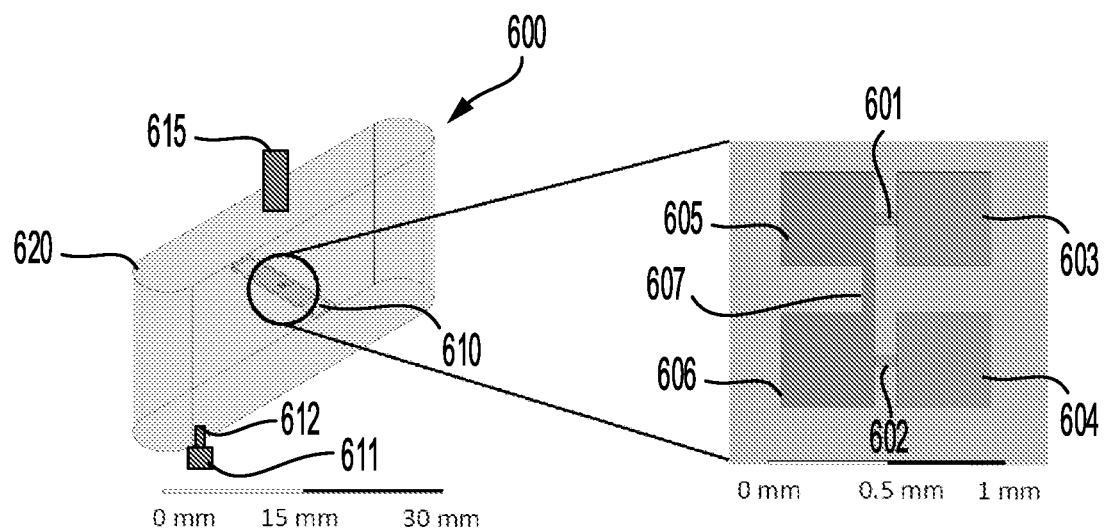
FIG. 6A is a schematic diagram of a nonlinear superconducting circuit, according to some embodiments.

FIG. 6A illustrates a nonlinear superconducting circuit 600, according to some embodiments. The superconducting circuit 600 includes a SNAIL 601, a SQUID 602, a first antenna portion 603, a second antenna portion 605, a third antenna portion 604, a fourth antenna portion 606, a superconducting connecting member 607, a substrate 610, a cavity 620, a magnetic flux source 615, a microwave pin 612, and a transmission line 611.

The superconducting circuit 600 includes the SNAIL 601 and the SQUID 602 as the first and second nonlinear superconducting devices, respectively. Thus, both nonlinear superconducting devices of the nonlinear superconducting circuit 600 include a superconducting ring through which an external magnetic flux is thread. The superconducting circuit 600 includes a magnetic flux source 615 for generating the external magnetic flux that can be used to control one or more parameters of the SNAIL 601 and the SQUID 602. In some embodiments, the magnetic flux source 615 is a solenoid that is located outside of the cavity 620. The magnetic flux source 615 is located above the substrate 610 and oriented such that the axis of the solenoid is perpendicular to the upper surface of the substrate 610.

The SNAIL 601 is physically connected to a first antenna that includes the first antenna portion 603 and the second antenna portion 605. The first antenna couples the SNAIL 601 to the microwave signals supported by the cavity 620. The first antenna portion 603 and the second antenna portion 605 are attached on opposite sides of the SNAIL 601.

The SQUID 602 is physically connected to a second antenna that includes the third antenna portion 604 and the fourth antenna portion 606. The second antenna couples the SQUID 602 to the microwave signals supported by the cavity 620. The third antenna portion 604 and the fourth antenna portion 606 are attached on opposite sides of the SQUID 602. Additionally, the second antenna portion 605 and the fourth antenna portion 606 are physically connected by a superconducting connecting member 607.

Microwave signals that drive the nonlinear superconducting circuit 600 are coupled to the cavity 620 via the transmission line 611 via the microwave pin 612, which interfaces with an aperture of the cavity 620. The substrate 610 is suspended in the cavity 620 such that the two antennas are near the center of the cavity 620.

Figure 6B:
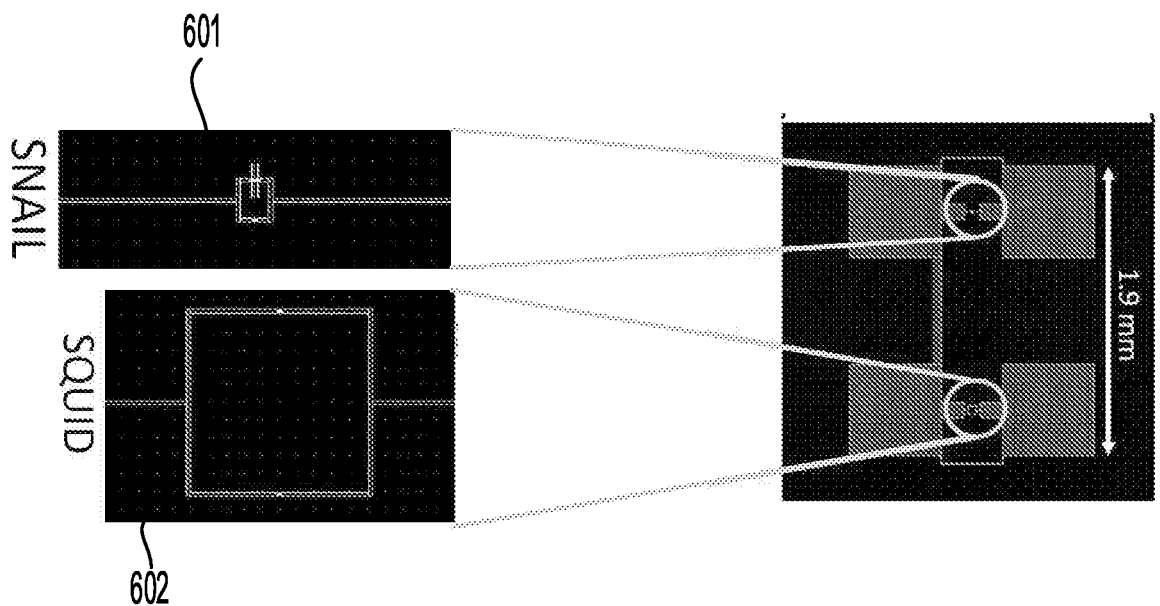
FIG. 6B is an optical microscope image of a nonlinear superconducting circuit that includes a SNAIL and a SQUID, according to some embodiments.

FIG. 6B is an optical microscope image of the portion of the substrate that includes the SNAIL 601, the SQUID 602, and the two antennas.

Figure 7:
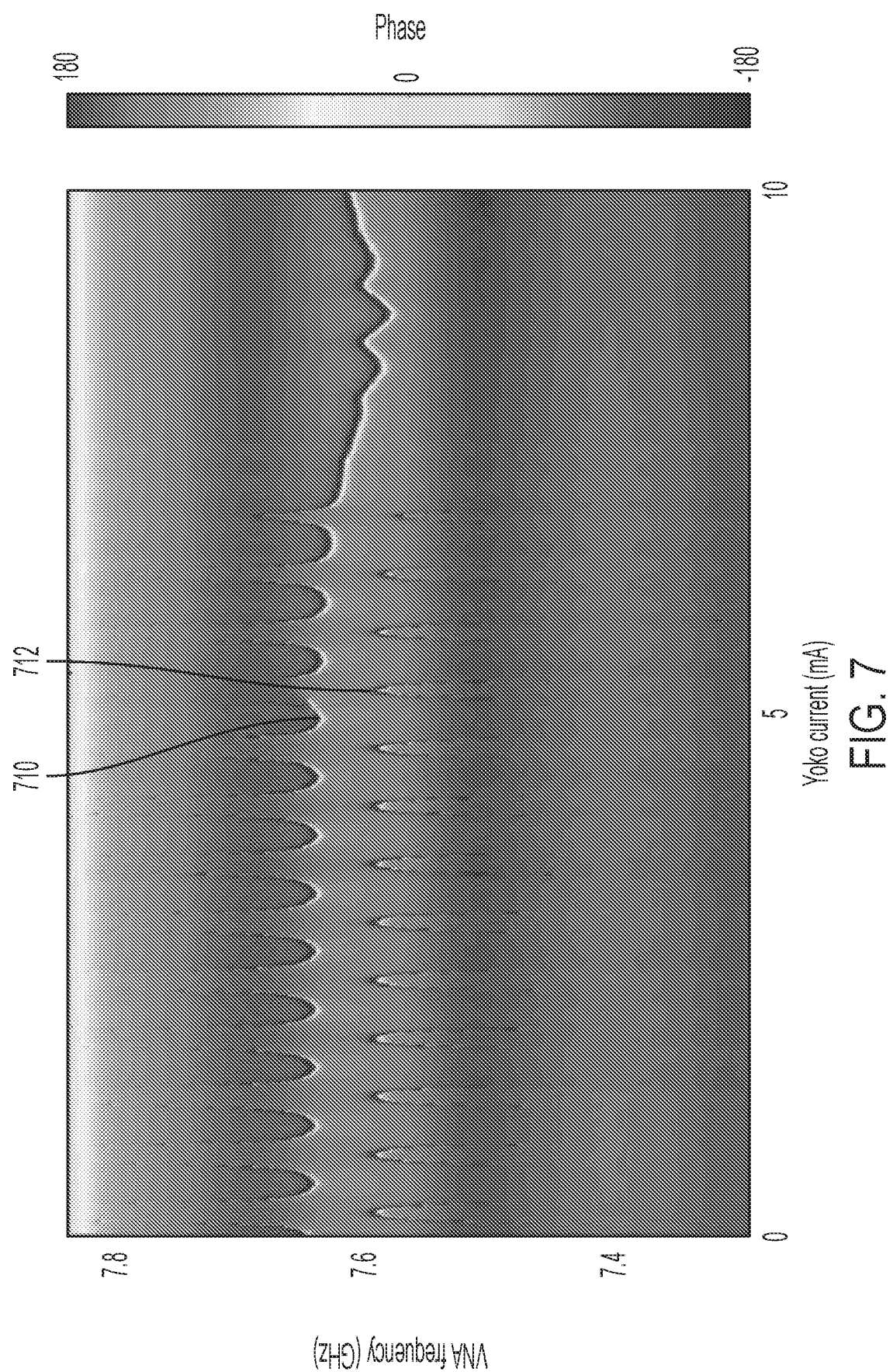
FIG. 7 is a spectrogram resulting from cavity spectroscopy of a nonlinear superconducting circuit using a vector network analyzer (VNA) as a function of current applied to the external magnetic field, according to some embodiments.

FIG. 7 is a spectrogram resulting from performing a heterodyne measurement of the cavity microwave signals as function of the scanning frequency of a vector network analyzer (VNA) and the current through the solenoid controlling the external magnetic field flux. Phase jumps (e.g., like those at points 710 and 712) in the spectrogram correspond with resonances where a mode of the nonlinear superconducting circuit 600 actively couples to the transmission line 611.

Figure 8:
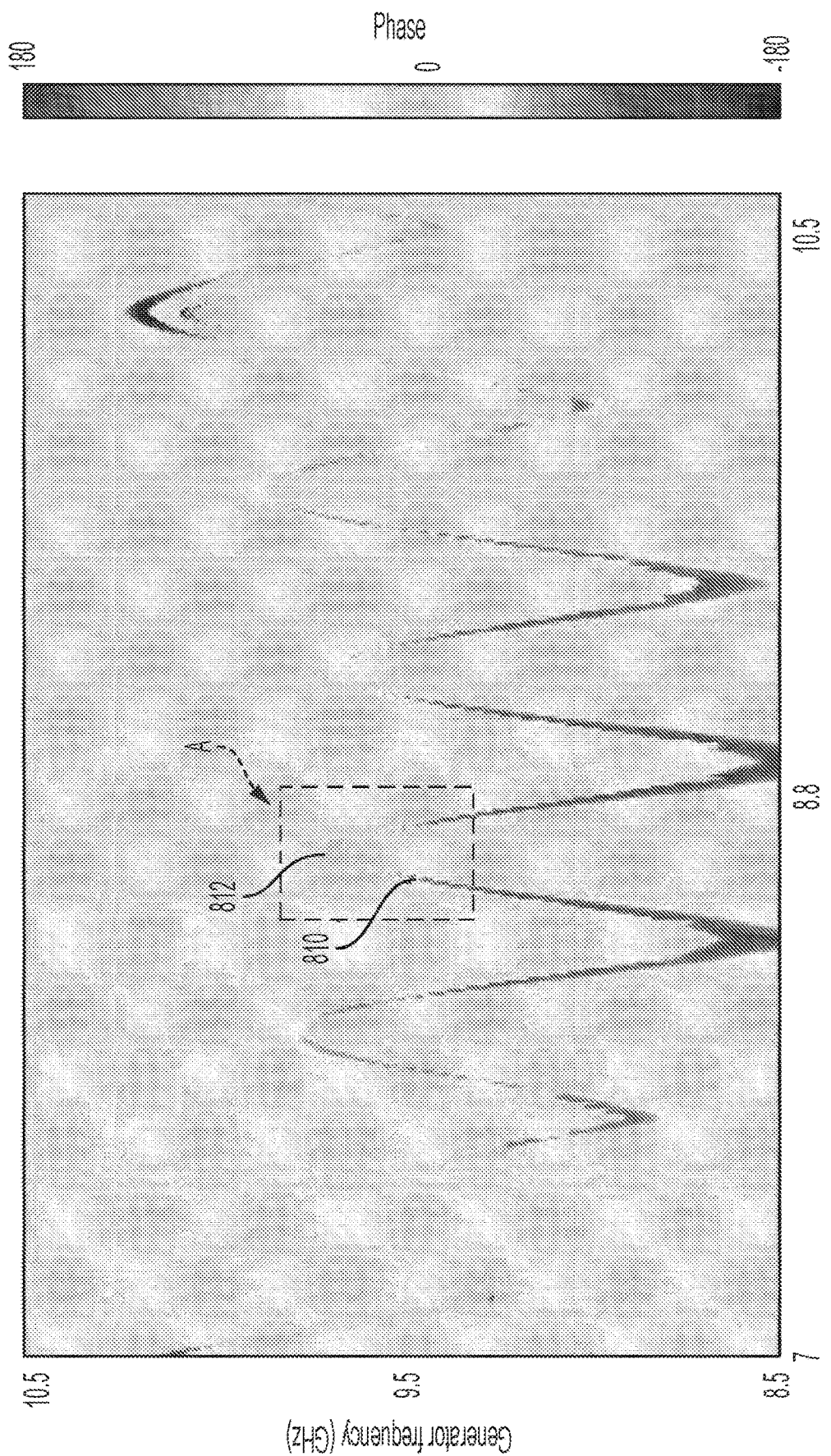
FIG. 8 is a spectrogram resulting from two-tone cavity spectroscopy of a nonlinear superconducting circuit using a vector network analyzer (VNA) as a function of current applied to the external magnetic field, according to some embodiments.

FIG. 8 is a two-tone spectrogram resulting from fixing the VNA frequency at approximately 7.6 GHz and applying a second microwave frequency using a microwave generator while sweeping the current applied to the solenoid controlling the external magnetic field flux. Phase jumps from positive phases (e.g., point 810) to negative phases (e.g., point 812) correspond to an operating points for performing four-wave-mixing according to some embodiments. Note that there are multiple operating points corresponding to different solenoid currents, any of which may be used as an operating point for four-wave-mixing.

Figure 9A:
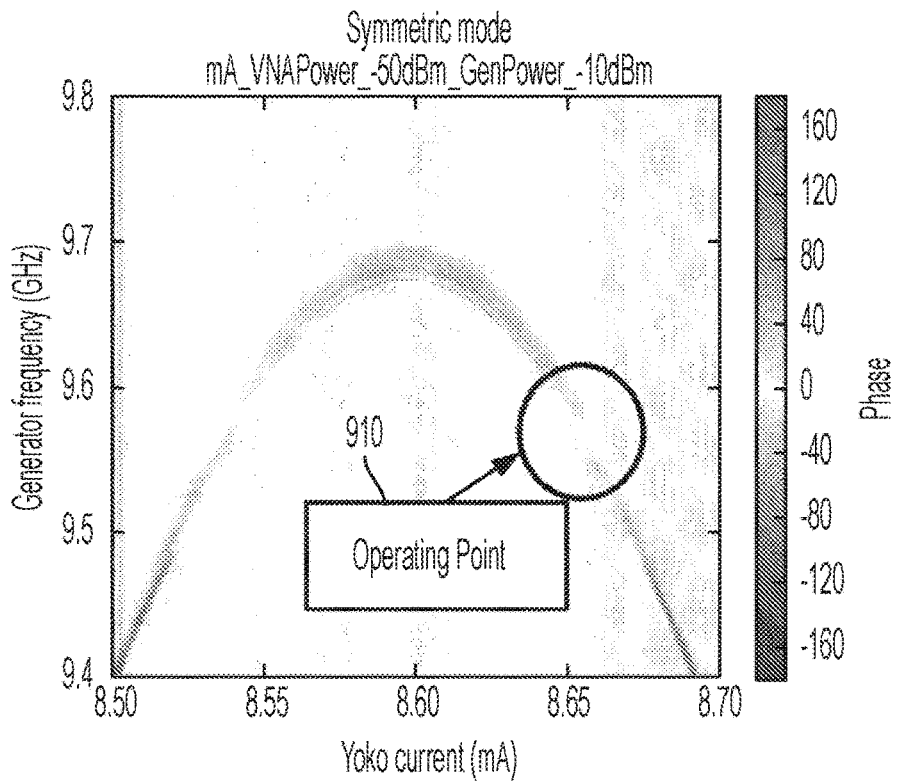
FIG. 9A is a detailed spectrogram in the region of Box A of FIG. 8 for the symmetric mode of a nonlinear superconducting circuit, according to some embodiments.
Figure 9B:
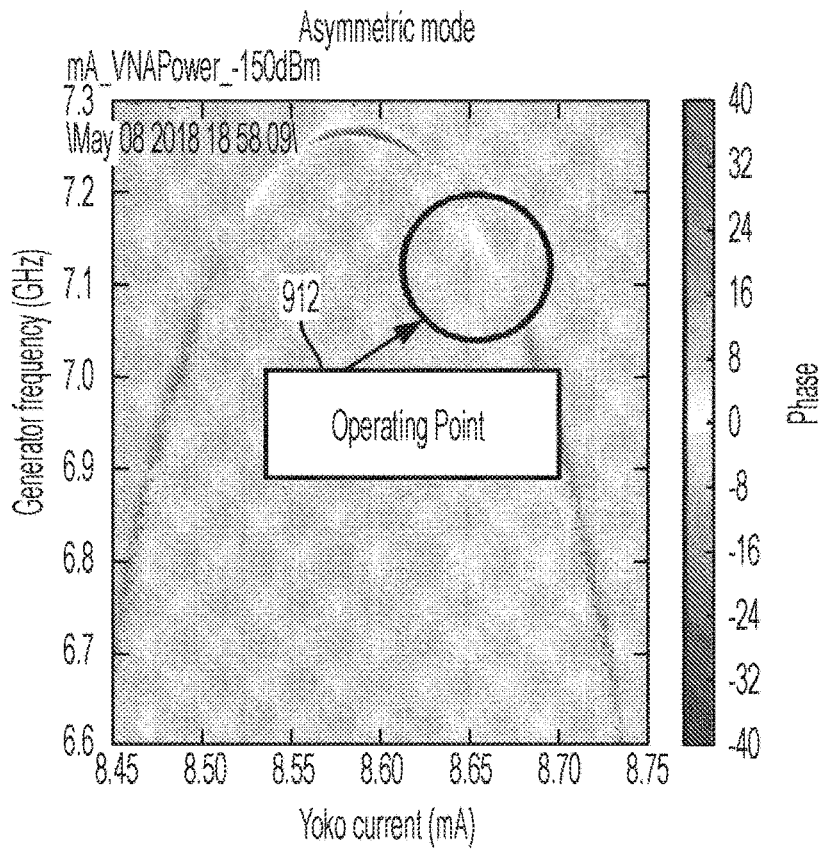
FIG. 9B is a detailed spectrogram in the region of Box A of FIG. 8 for the asymmetric mode of a nonlinear superconducting circuit, according to some embodiments.

FIG. 9A and FIG. 9B are zoomed in portions of the two-tone spectrogram corresponding to the region of Box A of FIG. 8 for the symmetric mode and asymmetric mode, respectively, of the nonlinear superconducting circuit 600. This region corresponds to two different operating points 910 and 912 with the same associated microwave frequency, but different external magnetic flux values (and therefore different solenoid current values).

Figure 10:
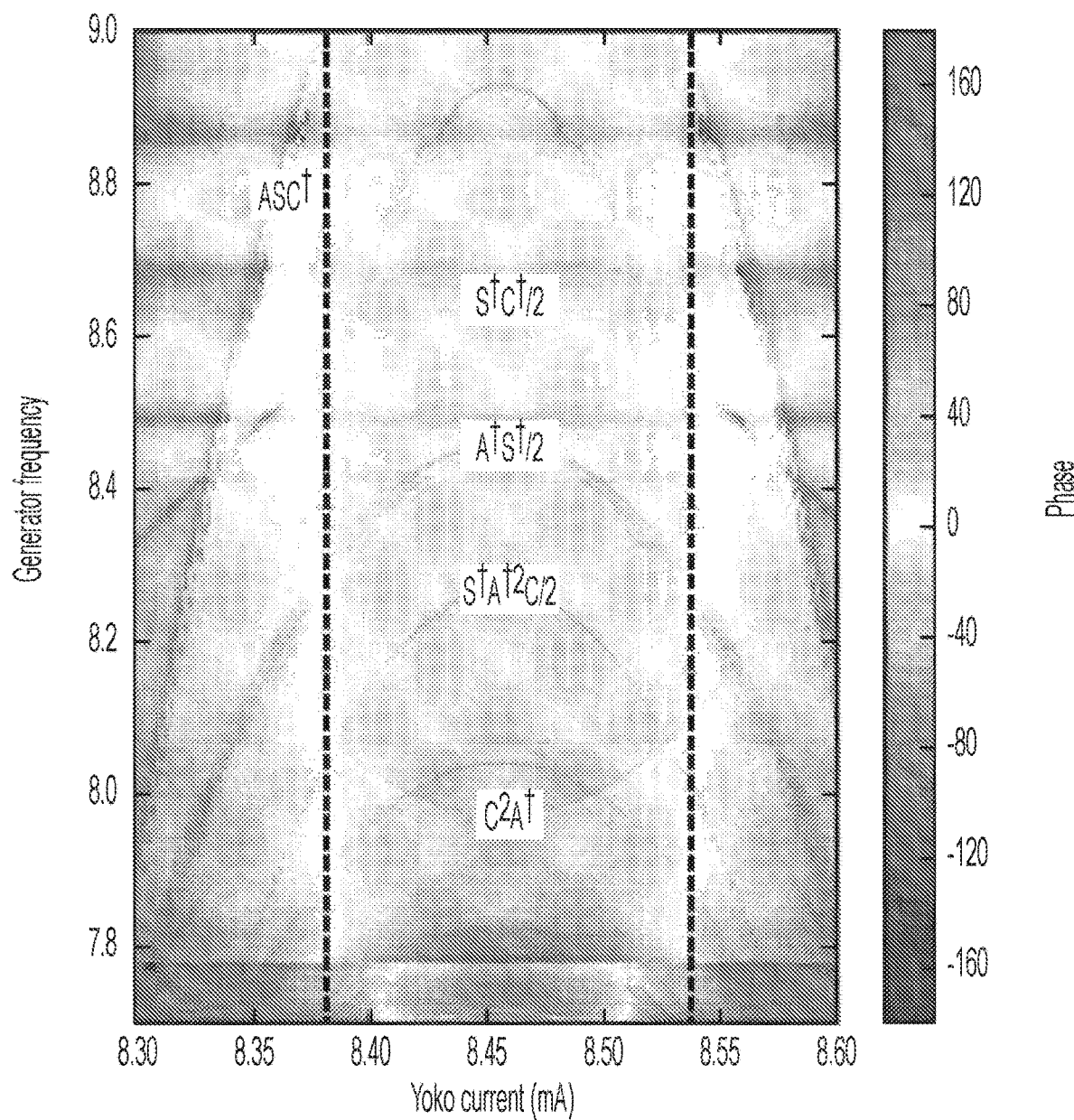
FIG. 10 is a spectrogram of a nonlinear superconducting circuit illustrating multiple operating points of a nonlinear superconducting circuit where Kerr/cross-Kerr cancellation occurs, according to some embodiments.

While the above discussion has focused on the four-wave mixing terms that correspond to the annihilation of two cavity microwave photons to form an anti-symmetric quanta in the superconducting circuit (e.g., the $C^2A^\dagger$ term) there are other terms that may be used under the same cancellation conditions if pumped at higher frequencies. These additional terms correspond to higher order terms of the Hamiltonian. FIG. 10 illustrates a spectrogram showing these higher order operating points. For example, terms corresponding to $S^\dagger A^{\dagger 2}C$, $A^\dagger S^\dagger$, $S^\dagger C$, and $ASC^\dagger$ interactions are shown in FIG. 10. To utilize these interactions, the nonlinear superconducting circuit is operated at the corresponding frequency and external magnetic flux.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A nonlinear superconducting circuit:
    a first nonlinear superconducting device with a potential having a positive anharmonicity;
    a second nonlinear superconducting device coupled to the first nonlinear superconducting device, wherein:
        the second nonlinear superconducting device has a potential with a negative anharmonicity; and
        a resonant frequency of the first nonlinear superconducting device is equal to a resonant frequency of the second nonlinear superconducting device.

2. The nonlinear superconducting circuit of claim 1, further wherein an inductance of the first nonlinear superconducting device is equal to an inductance of the second nonlinear superconducting device.

3. The nonlinear superconducting circuit of claim 1, wherein the first nonlinear superconducting device is one of a superconducting nonlinear asymmetric inductive element (SNAIL), a fluxonium qubit, or a radio frequency (RF) superconducting quantum interference device (SQUID), and the second nonlinear superconducting device is one of a transmon, a SQUID, or a SNAIL.

4. The nonlinear superconducting circuit of claim 1, wherein a resonant frequency of the first nonlinear superconducting device and/or a resonant frequency of the second nonlinear superconducting device is controlled using at least one magnet.

5. The nonlinear superconducting circuit of claim 4, wherein the first nonlinear superconducting device comprises a loop enclosing a first area and the second nonlinear superconducting device comprises a loop enclosing a second area different from the first area.

6. The nonlinear superconducting circuit of claim 1, further comprising a cavity, wherein the cavity is a three-dimensional resonator, and wherein the first nonlinear superconducting device and the second nonlinear superconducting device are coupled to the cavity.

7. The nonlinear superconducting circuit of claim 6, wherein the first nonlinear superconducting device and the second nonlinear superconducting device are capacitively coupled to the cavity.

8. The nonlinear superconducting circuit of claim 6, wherein:
the first nonlinear superconducting device comprises a first antenna configured to couple the first nonlinear superconducting device to the cavity; and
the second nonlinear superconducting device comprises a second antenna configured to couple the second nonlinear superconducting device to the cavity.

9. The nonlinear superconducting circuit of claim 8, further comprising a superconducting connecting member that connects a portion of the first antenna to a portion of the second antenna, and wherein:
the first antenna comprises a first antenna portion and a second antenna portion physically connected to opposite sides of the first nonlinear superconducting device; and
the second antenna comprises a third antenna portion and a fourth antenna portion physically connected to opposite sides of the second nonlinear superconducting device.

10. The nonlinear superconducting circuit of claim 6, wherein the first nonlinear superconducting device is coupled to the second nonlinear superconducting device such that the nonlinear superconducting circuit exhibits a symmetric mode and an asymmetric mode, wherein the symmetric mode couples linearly to the cavity and the asymmetric mode does not couple linearly to the cavity, or the asymmetric mode couples linearly to the cavity and the symmetric mode does not couple linearly to the cavity.

11. The nonlinear superconducting circuit of claim 1, wherein a magnitude $g_4$ of the first nonlinear superconducting device is equal to a magnitude of $g_4$ of the second nonlinear superconducting device.

12. The nonlinear superconducting circuit of claim 1, wherein a quartic coefficient of the potential of the first nonlinear superconducting device is equal to a quadratic coefficient of the potential of the first nonlinear superconducting device, wherein the quartic coefficient is an effective quartic coefficient that is a function of the quadratic coefficient, a cubic coefficient and a quartic coefficient of the potential of the first nonlinear superconducting device.

13. The nonlinear superconducting circuit of claim 1, wherein the first nonlinear superconducting device is a SNAIL comprising:
a single small Josephson junction; and
a plurality of large Josephson junctions, wherein a tunneling energy of the small Josephson junction is a fraction, a, of a tunneling energy of each of the plurality of large Josephson junctions.

14. The nonlinear superconducting circuit of claim 13, or any other preceding claim wherein the fraction, a, is greater than zero and less than 0.50.

15. The nonlinear superconducting circuit of claim 13, wherein the plurality of large Josephson junctions consists of exactly three Josephson junctions.

16. The nonlinear superconducting circuit of claim 13, wherein:
the plurality of large Josephson junctions consists of N Josephson junctions; and
the fraction, $\alpha$, is in a range from 1/N to $$\frac{1}{2}\left(\frac{1}{N} + \frac{1}{N^3}\right).$$

17. A method of controlling a nonlinear superconducting circuit comprising a first nonlinear superconducting device and a second nonlinear superconducting device, the method comprising:
driving the first nonlinear superconducting device and the second nonlinear superconducting device to produce a Hamiltonian with least one off-diagonal interaction and diagonal interactions equal to zero.

18. The method of claim 17, wherein driving the first nonlinear superconducting device and the second nonlinear superconducting device comprises using microwave signals.

19. The method of claim 18, wherein:
the nonlinear superconducting circuit further comprises a cavity, wherein the cavity is a three-dimensional resonator;
the first and second nonlinear superconducting devices are coupled to the cavity; and
the microwave signals are supported by the cavity.

20. The method of claim 19, further comprising:
coupling the first nonlinear superconducting device to the cavity using a first antenna; and
coupling the second nonlinear superconducting device to the cavity using a second antenna.

21. The method of claim 17, further comprising applying an external magnetic field to control a resonance frequency of the first nonlinear superconducting device and/or the second nonlinear superconducting device.

22. The method of claim 17, further comprising driving the nonlinear superconducting circuit such that the nonlinear superconducting circuit exhibits a symmetric mode and an asymmetric mode.

23. The method of claim 22, wherein the symmetric mode couples linearly to the cavity and the asymmetric mode does not couple linearly to the cavity.

* * * * *

UNITED STATES PATENT AND TRADEMARK OFFICE
CERTIFICATE OF CORRECTION

PATENT NO. : 11,791,818 B2
APPLICATION NO. : 17/423631
DATED : October 17, 2023
INVENTOR(S) : Shantanu Mundhada et al.

It is certified that error appears in the above-identified patent and that said Letters Patent is hereby corrected as shown below:

In the Specification

At Column 1, immediately after the title and before the first paragraph, the following CROSS-REFERENCE TO RELATED APPLICATIONS section:
"The present application claims the benefit under 35 U.S.C. § 119(e) of U.S. Provisional Patent Application No. 62/793,850, filed Jan. 17, 2019, and titled "JOSEPHSON NONLINEAR CIRCUIT," which is hereby incorporated by reference in its entirety. The present application claims the benefit under 35 U.S.C. § 119(e) of U.S. Provisional Patent Application No. 62/812,714, filed Mar. 1, 2019, and titled "JOSEPHSON NONLINEAR CIRCUIT," which is hereby incorporated by reference in its entirety."

Should read:
-- The present application is a national stage filing under 35 U.S.C. 371 of International Patent Application Serial No. PCT/US2020/013675, filed January 15, 2020, entitled "JOSEPHSON NONLINEAR CIRCUIT which claims the benefit under 35 U.S.C. § 119(e) of U.S. Provisional Patent Application No. 62/793,850, filed January 17, 2019, and titled "JOSEPHSON NONLINEAR CIRCUIT," which is hereby incorporated by reference in its entirety. The present application also claims the benefit under 35 U.S.C. § 119(e) of U.S. Provisional Patent Application No. 62/812,714, filed March 1, 2019, and titled "JOSEPHSON NONLINEAR CIRCUIT,". The contents of these applications are hereby incorporated by reference in their entirety. --

At Column 1, immediately after the CROSS-REFERENCE TO RELATED APPLICATIONS section, the following FEDERALLY SPONSORED RESEARCH section:
"The present application is a national stage filing under 35 U.S.C. 371 of International Patent Application Serial No. PCT/US2020/013675, filed Jan. 15, 2020, entitled "JOSEPHSON NONLINEAR CIRCUIT ", which claims the benefit under 35 U.S.C. § 119(e) of U.S. Provisional Patent Application No. 62/793,850, filed Jan. 17, 2019, and titled "JOSEPHSON NONLINEAR CIRCUIT," which is hereby incorporated by reference in its entirety. The present application also claims the benefit under 35 U.S.C. § 119(e) of U.S. Provisional Patent Application No. 62/812,714, filed Mar. 1, 2019, and titled "JOSEPHSON NONLINEAR CIRCUIT,". The contents of these Signed and Sealed this
Sixteenth Day of January, 2024

*Katherine Kelly Vidal*
Katherine Kelly Vidal
*Director of the United States Patent and Trademark Office* applications are hereby incorporated by reference in their entirety."

Should read:
-- This invention was made with government support under W911NF-18-1-0212 awarded by the United States Army Research Office and under 1609326 awarded by the National Science Foundation. The government has certain rights to the invention. --

In the Claims

At Column 16, Line 1, Claim 13:
"fraction, a, of a tunneling energy of each of the plurality"

Should read:
-- fraction, α, of a tunneling energy of each of the plurality --

At Column 16, Line 4, Claim 14:
"any other preceding claim wherein the fraction, a, is greater"

Should read:
-- any other preceding claim wherein the fraction, *α*, is greater --